US006504778B1

(12) United States Patent
Uekubo

(10) Patent No.: US 6,504,778 B1
(45) Date of Patent: Jan. 7, 2003

(54) SEMICONDUCTOR MEMORY DEVICE

(75) Inventor: Masaki Uekubo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/686,676

(22) Filed: Oct. 11, 2000

(30) Foreign Application Priority Data

Oct. 13, 1999 (JP) .......................................... 11-291663

(51) Int. Cl.[7] ............................ G11C 7/02; G11C 16/06

(52) U.S. Cl. .................... 365/207; 365/210; 365/185.2; 365/185.21

(58) Field of Search ......................... 365/185.11, 185.2, 365/185.21, 205, 207, 208, 210; 375/257

(56) References Cited

U.S. PATENT DOCUMENTS

| | | | | |
|---|---|---|---|---|
| 5,528,543 A | | 6/1996 | Stiegler | 365/210 |
| 5,559,737 A | * | 9/1996 | Tanaka et al. | 365/185.2 |
| 5,659,503 A | * | 8/1997 | Sudo et al. | 365/185.2 |
| 5,675,535 A | * | 10/1997 | Jinbo | 365/185.2 |
| 5,850,365 A | | 12/1998 | Reese et al. | 365/207 |
| 5,936,888 A | * | 8/1999 | Sugawara | 365/185.2 |
| 5,943,286 A | * | 8/1999 | Orita | 365/185.2 |
| 6,091,655 A | | 7/2000 | Yamada et al. | 365/210 |
| 6,185,256 B1 | * | 2/2001 | Saito et al. | 375/257 |
| 6,191,979 B1 | * | 2/2001 | Uekubo | 365/185.2 |
| 6,282,114 B1 | * | 8/2001 | Hanriat et al. | 365/185.2 |

FOREIGN PATENT DOCUMENTS

| | | |
|---|---|---|
| JP | 11-17037 | 1/1999 |
| JP | 11-306785 | 11/1999 |

* cited by examiner

*Primary Examiner*—Trong Phan

(57) ABSTRACT

There is provided a semiconductor memory device in which the trouble in reading data due to an overshoot of a data signal can be avoided even when a reference signal for giving a reference for the determination a logical value of the data signal from a memory cell is constantly generated. This semiconductor memory device is constructed such that data is read by comparing a data signal from a memory cell with a reference signal from a reference cell in a differential-type sense amplifier. The semiconductor memory device comprises a feedback circuit for limiting a relative change between the reference signal and the data signal received by the differential-type sense amplifier. This feedback circuit momentarily feeds an output of the differential-type sense amplifier back to its input node, when data stored in the memory cell is read out, to thereby momentarily render the data signal and the reference signal equal to each other.

22 Claims, 10 Drawing Sheets

SEMICONDUCTOR MEMORY DEVICE

BACKGROUND OF THE INVENTION

1. Field of the Invention

This invention relates generally to semiconductor memory devices such as a flash memory, an EPROM (Erasable and Programmable Read Only Memory) and a ROM (Read Only Memory), and more particularly to a semiconductor memory device of such type that data is read by comparing a data signal from a memory cell with a reference signal/reference voltage from a reference cell.

This application is based on Japanese Patent Application No. Hei 11-291663, the contents of which are incorporated herein by reference.

2. Description of the Related Art

In general, a semiconductor memory device such as a flash memory is constructed so that multi-bit (eight-bit, for example) can be inputted and outputted. A principal structure of a read system in a semiconductor memory device of such type is shown in FIG. 8. As shown in FIG. 8, a memory cell array 1100, comprising non-volatile memory cells (not shown) arranged in a matrix, is divided into blocks 1100-1 to 1100-8 in correspondence with data bits D0 to D7 of external data D, respectively.

A plurality of word lines WL are arranged to extend in the row direction of the memory cell array 100 so as to pass through the blocks 1100-1 to 1100-8 with each word line being connected to control gates of those plural memory cells which belong to the same row. A plurality of bit lines BL are arranged in each block to extend in the column direction with each bit line being connected to one terminals (sources or drains) of current paths of those memory cells which belong to the same column.

The word lines WL of the memory cell array 1100 are connected to a row decoder 1200, while the bit lines BL are connected to a column selector 1300. The column selector 1300 is constructed such that one of the bit lines BL is selected for each of the blocks 1100-1 to 1100-8 in accordance with a column address fed from the outside.

A group of sense amplifiers 1400 comprises eight sense amplifiers of the current detection type corresponding respectively to the block 1100-1 to 1100-8 of the memory cell array 1100 and is constructed so as to detect currents of data signals which will appear on the respective bit lines selected by the column selector 1300. Outputs Vdata-1 to Vdata-8 from the respective sense amplifiers in the sense amplifier group 1400 are supplied to one input parts of differential-type sense amplifiers 1501 to 1508, respectively. The other input parts of these differential-type sense amplifiers 1501 to 1508 are supplied with a reference signal Vref which gives a reference for determining logical values of the data signals as will later be described.

A reference cell 1100R is provided for deriving the reference signal Vref to be supplied to the above-described differential-type sense amplifiers 1501 to 1508 and is constructed comprising a plurality of reference memory cells which correspond in number to those memory cells in one row of the memory cell array 1100. These reference memory cells are connected to a reference bit line BLR. The bit line BLR of the reference cell is connected through a reference column selector 1300R, which is equivalent in terms of load to the column selector 1300, to an input part of a sense amplifier of the current detection type 1400R which corresponds to each sense amplifier in the above-described sense amplifier group 1400.

This sense amplifier 1400R is provided for current-detecting a signal outputted from the reference cell 1100R to thereby supply the above reference signal Vref to the sense amplifiers 1501 to 1508, and is designed such that a level of this reference signal Vref falls in the range between a high level and a low level of a data signal which will be outputted from each sense amplifier in the sense amplifier group 1400 as later described.

A control circuit 1700 is provided for controlling the level of the reference signal Vref in accordance with the mode of operation, For a flash memory, for example, there are provided operation modes such as a write verify mode in which the state of a memory cell into which data has been written is verified and an erase verify mode in which the state of a memory cell for which an erasure of data has been performed is verified. The levels of the reference signal Vref needed in these operation modes are different from each other.

The control circuit 1700 is to adjust the reference cell to a predetermined threshold value in the manufacturing stage of the device. This adjustment to the threshold value is carried out in such a manner that, after the initial erasure of the reference cell, a writing operation thereto is repeated until the threshold value of the reference cell reaches the predetermined threshold value.

More specifically, in order to erase the reference cell a negative voltage of about −16 volts is first applied, for example, to its gate with its source, drain and substrate being applied with a voltage of zero volt to expel electrons from a floating gate in the direction of the substrate in accordance with the FN (Fowler-Nordheim) tunneling method. Thereafter, a positive voltage of about 12 volts is applied, for example, to the gate with the drain being applied with a voltage of about six volts and with the source and substrate being applied with a voltage of zero volt to perform a write operation by injecting electrons into the floating gate in accordance with the CHE (Channel Hot Electron) method.

Thereafter, it is verified whether the correct threshold value has been obtained (write verify) by detecting the current flowing through the reference cell in the condition that a voltage of 3 volts is applied to the gate with the drain and source being applied respectively with voltages of 1 volt and zero volt. If electrons have been injected excessively an erase operation is carried out while a rewrite operation is carried out if electrons lack, depending on the result of the verification. The above process is repeated until the threshold value of the reference cell reaches the predetermined threshold value.

In general, an erase verify and a write verify are carried out with the sensitivity of the sense amplifier 1400R being changed over, More specifically, a load transistor 1401R shown in FIG. 9 (which will later be described) is constructed with a plurality of transistors whose gates and drains are connected in parallel and whose sources are connected to a supply voltage (Vdd) by switching transistors interposed therebetween. By controlling on/off states of the switching transistors, a resistance value of this load transistor and hence the level of the reference signal can be changed.

Although not shown, the above-described control circuit is provided not only for the reference cell but also for the sense amplifiers 1400-1 to 1400-8 one by one to generate various voltages for the read, write, erase and verify operations.

FIG. 9 shows, as an example, a more specific circuit structure of the read system for data D0.

In FIG. 9, the block 1100-1 is that one of the blocks 1100-1 to 1100-8 forming the memory cell array 1100 which comprises the memory cells for storing data corresponding to data D0. This block 1100-1 comprises non-volatile memory cells 1100M-1 arranged in a matrix to which a plurality of word lines WL and a plurality of bit lines BL-1 are connected. A driver 1200D is a driver for driving the word lines WL and constitutes an output stage of the row decoder 1200. The driver 1200D is constructed with CMOS (Complementary Metal Oxide Semiconductor) inverters each having an input part and a source of a p-type transistor which are supplied with a respective one of pre-decoded row address signals.

A selector 1300-1 forms a part of the column selector 1300 shown in FIG. 8, which part serves to select one of the plurality of bit lines BL-1 of the block 1100-1. The selector 1300-1 comprises a plurality of n-type transistors one of which selectively conducts in accordance with pre-decoded column address YS0 to YSn. One end of current paths of these transistors are connected to the bit lines of the block 1100-1, respectively, while the other ends thereof are connected in common to a data line DL-1. With this selector 1300-1, by selectively bringing any one bit of the column address YS0 to YSn to a high level, a corresponding one of the data signals appearing on the plurality of bit lines BL-1 of the block 1100-1 is selectively supplied to the data line DL-1.

A sense amplifier 1400-1 of the current detection type detects a current signal outputted from the memory cell onto the data line DL-1 as a data signal and outputs a voltage signal corresponding to the current signal. This sense amplifier 1400-1 is comprised of a p-type transistor 1401 connected on the power supply side as a load, an n-type transistor 1402 connected between the transistor 1401 and the data line DL-1 for the current detection, and a combination of a p-type transistor 1403 and n-type transistors 1404 and 1405 which constitutes an inverter circuit 1406 for controlling a gate voltage of the transistor 1402. The sense amplifier 1400-1 outputs a voltage signal appearing at a node between the transistor 1401 and the transistor 1402 as a data signal Vdata-1.

The inverter circuit formed by the transistors 1403 to 1405 is constructed such that the level of its output signal can be fixed by a sense amplifier enable signal SAE. Thus, the active state of the sense amplifier 1400-1 is controlled by the sense amplifier enable signal SAE. More specifically, when the sense amplifier enable signal SAE is at a low level, the transistor 1403 functions as a load of the transistor 1404 and the transistor 1405 is fixed in an off state. As a result, an inverter formed by the transistors 1403 and 1404 functions, so that a voltage corresponding to the data signal appearing on the data line DL-1 is outputted to the gate of the transistor 1402 and thus this sense amplifier 1400-1 is brought into an active state.

At this time, if there exists a current flowing through the memory cell, the signal level at the data line DL-1 drops and the inverter receiving this level drives the gate voltage of the transistor 1402 towards a high level. Consequently, the transistor 1402 is turned on, causing the voltage level of the data signal Vdata-1 to be lowered. Conversely, if there exists no current flowing through the memory cell, the gate voltage of the transistor 1402 becomes stable at a level which is a threshold voltage of the transistor higher than the source voltage (the signal level on the data line DL-1) of the transistor 1402. As a result, the transistor 1402 is turned off, so that the voltage level of the data signal Vdata-1 goes up.

When the sense amplifier enable signal SAE is at a high level, the transistor 1405 is fixed in an on state. Consequently, the output signal of the inverter formed by the transistors 1403 and 1404 is brought to a low level, so that the transistor 1402 is fixed in an off state and the data signal Vdata-1 is fixed at a high level. As a result, the sense amplifier 1400-1 becomes inactive.

The reference cell 1100R is constituted comprising a reference memory cell 1100MR whose gate voltage is controlled by a driver 1200DR and a plurality of memory cells 1100MD whose control gates are grounded, all the memory cells 1100MR and 1100MD being connected to the reference bit line BLR. Each of these memory cells 1100MR and 1100MD for the referencing purpose is formed so as to possess properties equivalent to those of a regular memory cell belonging to the above-described memory cell array 1100. The reference memory cell that actually functions is solely the memory cell 1100MR.

The reference bit line BLR is connected to the reference data line DLR through the reference column selector 1300R which is constituted by an n-type transistor whose properties are equivalent to those of a transistor within the column selector 1300. The transistor constituting the column selector 1300R has a gate connected to the power supply and is fixed in the on state. Thus, the bit line BLR is connected through the column selector 1300R and the data line DLR to a sense amplifier 1400R of the current detection type, so that this sense amplifier 1400R always receives a current signal from the reference memory cell 1100MR.

The sense amplifier 1400R of the current detection type has basically the same structure as the above-described sense amplifier 1400-1 of the current detection type and detects the current signal outputted from the reference cell 1100R to the data line DLR to thereby output a voltage signal as the reference signal Vref. More specifically, the sense amplifier 1400R is comprised of a p-type transistor 1401R connected on the power supply side as a load, an n-type transistor 1402R connected between the transistor 1401R and the data line DLR for the current detection, and a combination of a p-type transistor 1403R and n-type transistors 1404R and 1405R which constitutes an inverter circuit 1406R for controlling a gate voltage of the transistor 1402R. The sense amplifier 1400R outputs a voltage signal appearing at a node between the transistor 1401R and the transistor 1402R as the reference signal Vref. The inverter circuit 1406R is controlled by a sense amplifier enable signal SAER, whereby the active state of this sense amplifier is controlled.

The size (e.g., a gate width and a gate length) of each of the transistors 1401 and 1401R is selected such that the current drive capacity of the transistor 1401R within the sense amplifier 1400R is greater than that of the transistor 1401 within the sense amplifier 1400-1. In general, the size of each of the load transistors 1401 and 1401R is determined, taking into consideration the drain current-gate voltage characteristic of the memory cell before data is written thereinto, the drain current-gate voltage characteristic of the memory cell after data was written thereinto and the supply voltage characteristic, in such a manner that the level of the reference signal Vref takes a proper value between the high and low levels of the data signal Vdata-1.

The data signal Vdata-1 from the above-described sense amplifier 1400-1 and the reference signal Vref from the sense amplifier 1400R are supplied to a differential-type sense amplifier 1510 and compared therein. In this example, the differential-type sense amplifier 1501 is adapted to output a signal of logical value "0" when the level of the data signal Vdata-1 is higher than that of the reference signal Vref and to output a signal of logical value "1" when the level of the data signal Vdata-1 is lower than that of the reference signal Vref.

Although not shown specifically, this semiconductor memory device comprises therein, apart from the constituent elements shown in FIGS. 8 and 9, various other peripheral circuits such as an address buffer for receiving an address from the outside and loading it thereinto as an internal address signal, a pre-decoder for pre-decoding an address, an output buffer for supplying the signals fed from the sense amplifiers to the outside and a control circuit for effecting various controls.

The operation of the conventional semiconductor memory device constructed as described above will now be described with respect to an exemplary case where data (the data corresponding to the external data D0) stored in a memory cell within the block 1100-1 is read out.

The row decoder 1200 drives one of the word lines in the memory cell array 1100 to a high level in accordance with a row address fed from the outside. As a result, all the memory cells connected to the word line driven to the high level are simultaneously activated, so that data signals are outputted in parallel from these memory cells on the one line onto the respective bit lines.

In parallel with this activation of the above memory cells, the column selector 1300-1 selects one of the plural bit lines in the block 1100-1 in accordance with the column address YS0 to YSn, whereby the data signal (a current signal) outputted onto this bit line from the memory cell is supplied through the data line DL-1 to the sense amplifier 1400-1 in the sense amplifier group 1400. This sense amplifier 1400-1 is activated by the sense amplifier enable signal SAE to detect the current signal supplied as the data signal to thereby output the data signal Vdata-1 in the form of a voltage signal to the differential-type sense amplifier 1501.

On the other hand, the reference sense amplifier 1400R is activated, at the same time, by the sense amplifier enable signal SAER to detect the current signal continuously supplied from the reference cell 1100R to thereby output the reference signal Vref in the form of a voltage signal.

As shown in FIG. 10, in response to the sense amplifier enable signal SAE, the data signal Vdata-1 and the reference signal Vref both received by the differential-type sense amplifier 1501 rise simultaneously. Then, the data signal Vdata-1 will become stable at a level which is higher or lower than the reference signal Vref depending upon the data stored in the memory cell whose reading was aimed at. In the example shown in FIG. 10, the memory cell has been erased and is in the condition that data "1" is stored. In this case, since the memory cell conducts to flow a current, the data signal Vdata-1 becomes stable at a level lower than the reference signal Vref, so that data "1" is read out and supplied to the outside as the data D0.

The sense amplifier 1501 compares the data signal Vdata-1 with the reference signal Vref and outputs a voltage signal having a logical value determined in dependence upon the relation in magnitude between these signals. In this example, since the level of the data signal Vdata-1 is lower than the reference signal Vref, the sense amplifier 1501 outputs a signal with a logical value "1". The output signal of this sense amplifier 1501 is sent as data D0 to the outside through a not-shown output buffer. In parallel with the above-described operation for reading the data D0, reading of data D1 to D7 respectively from the blocks 1100-2 to 1100-8 is carried out.

As shown in FIG. 10, when the sense amplifiers 1400-1 and 1400R are activated simultaneously in response to the activation of the sense amplifier enable signals SAE and SAER, the data signal Vdata-1 and the reference signal Vref simultaneously rise and a voltage difference corresponding to the data develops between these signals, based on which the data is read out.

In the above case, as the source voltage of the transistor 1402 in the sense amplifier 1400-1 shown in FIG. 9 goes up, for example, the output of the inverter circuit 1406 constituted by the transistors 1403 and 1404 goes down, as a result of which the transistor 1402 will be rendered off. However, due to a delay in the inverter circuit 1406, the gate voltage of the transistor 1402 does not follow the change of its source voltage in real time, so that the time when the transistor 1402 goes off will be delayed. As a result, the data signal Vdata-1 goes up to an excessive level and an overshoot of the data signal Vdata-1 is caused. Also, an overshoot of the reference signal Vref is caused for the same reason.

In the above situation, if the reference signal Vref is always generated at a fixed voltage as shown in FIG. 11, the voltage difference between the data signal Vdata-1 and the reference signal Vref momentarily becomes excessively large due to an overshoot of the data signal Vdata-1 caused, so that the differential-type sense amplifier receiving these signals will saturate. Consequently, the operation of this differential-type sense amplifier does not rapidly follow the subsequent change of data, causing a failure in reading the data.

According to the above-described conventional device, however, even if the data signal Vdata-1 overshoots, since the reference signal Vref also overshoots in a similar manner, the relative change of the two signals due to their overshoots is cancelled in substance, so that the required voltage difference can immediately be obtained. Thus, the differential-type sense amplifier does not saturate and the correct reading of data can be achieved.

As described above, in the conventional semiconductor memory device, the reference signal Vref from the reference cell is supplied in common to the plurality of differential-type sense amplifiers so that each differential-type sense amplifier can compare the data signal from a respective one of the blocks with this reference signal to achieve the reading of multi-bit data.

In the meantime, in recent years the storage capacity of this type of semiconductor memory devices has significantly increased and their application has also been diversified. In a recent mobile-phone hand set, for example, it will be required that two processes be simultaneously carried out with a single semiconductor memory device. For example, a list of telephone numbers is read from a non-volatile semiconductor memory device while received data is being stored therein, or received data is erased while the telephone number of a called person is being read and dialed. To meet such requirements, there has been proposed such a structure that a single semiconductor memory device is divided into a plurality of banks to make it possible to simultaneously perform reading from and/or writing into a plurality of memory cells.

As described above, however, the control circuit 1700 is needed for each reference sense amplifier 1400R, and the size of this control circuit 1700 is substantially large even for a single bank. Thus, since the control circuit 1700 has a material influence on the chip area, a semiconductor memory device of the bank structure suffers from a problem that the chip area significantly increases as the number of banks increases.

For a semiconductor memory device of the bank structure, one may conceive, from the viewpoint of simplifying the peripheral circuits, that the circuit for generating the reference signals Vref is shared by the respective banks. In this case, however, the reference signal Vref need to be generated continuously to keep the independency of the operation of each bank. When the reference signal Vref is continuously generated, the difference between the data signal and the reference signal Vref may become momentarily excessively large due to the overshooting of the data signal, which may cause a problem that the reading of data may fail.

SUMMARY OF THE INVENTION

It is therefore an object of the present invention to provide a semiconductor memory device which can avoid problems caused by an overshoot of a data signal when reading data, without bringing about an increase of the chip area even when a reference signal, which gives a reference when determining a logical value of a data signal from a memory cell, is constantly generated.

In order to solve the above problems, the present invention has the following structures.

A first semiconductor memory device according to the invention comprises a differential amplifier (for example, a differential-type sense amplifier 150A-0 which will be described later) for comparing a data signal (for example, a data signal VDA-0 which will be described later) from a memory cell (for example, a memory cell 110MA-0 which will be described later) with a reference signal (for example, a reference signal VREF which will be described later) from a reference cell (for example, a reference memory cell 110MR which will be described later) to read data stored in the memory cell, and a circuit (for example, a feedback circuit 200A-0, a signal correction circuit 300A-0, a limiter circuit 400A-0 all of which will be described later) for limiting a relative change between the reference signal and the data signal which are received by the differential amplifier.

With this structure, the data signal from a memory cell will be higher or lower than the reference signal from the reference cell depending on the content of the data. The differential amplifier compares the data signal with the reference signal and outputs a signal representative of the relation in magnitude of these signals. For example, when the data signal is higher than the reference signal, a signal corresponding to data "1" is outputted. Conversely, when the data signal is lower than the reference signal, a signal corresponding to data "0" is outputted. More specifically, depending upon the content of data stored in a memory cell, the data signal from this memory cell changes with respect to the reference signal, so that a difference will develop between these signals. The differential amplifier amplifies this difference to output a signal corresponding to the data stored in the memory cell.

In the above situation, the relative change between the reference and data signals received by the differential amplifier is limited. In this case, if the relative change between the reference and data signals is limited to such an extent that the reading of data by the amplification of the difference between the data signal from the memory cell and the reference signal is not hampered, the differential amplifier will not excessively be saturated and the output signal of the differential amplifier will quickly follow the variation of the data signal. Therefore, the trouble in reading data due to an overshoot of the data signal can be avoided without causing an increase in chip area and even when the reference signal for giving a reference when determining a logical value of the data signal from the memory cell is constantly generated.

A second semiconductor memory device according to the invention comprises a differential amplifier (for example, a differential-type sense amplifier 150A-0 which will be described later) for comparing a data signal (for example, a data signal VDA-0 which will be described later) from a memory cell (for example, a memory cell 110MA-0 which will be described later) with a reference signal (for example, a reference signal VREF which will be described later) from a reference cell (for example, a reference memory cell 110MR which will be described later) to read data stored in the memory cell, and a circuit (for example, a signal correction circuit 300A-0 which will be described later) for reflecting the data signal upon the reference signal so that a change of the data signal relative to the reference signal is suppressed.

With this structure, the data signal from a memory cell will be higher or lower than the reference signal from the reference cell depending on the content of the data. The differential amplifier compares the data signal with the reference signal and outputs a signal representative of the relation in magnitude of these signals. For example, when the data signal is higher than the reference signal, a signal corresponding to data "1" is outputted. Conversely, when the data signal is lower than the reference signal, a signal corresponding to data "0" is outputted. More specifically, depending upon the content of data stored in a memory cell, the data signal from this memory cell changes with respect to the reference signal, so that a difference will develop between these signals. The differential amplifier amplifies this difference to output a signal corresponding to the data stored in the memory cell.

In the above situation, the data signal is reflected on the reference signal in such a manner that the change of the data signal from the memory cell relative to the reference signal from the reference cell is suppressed. For example, when the level of the data signal goes up, the level of the reference signal received by the differential amplifier also goes up. Conversely, when the level of the data signal goes down, the level of the reference signal received by the differential amplifier also goes down. As a result, the relative change between the reference and data signals is suppressed, so that the differential amplifier will not excessively be saturated and the output signal of the differential amplifier will quickly follow the variation of the data signal. Therefore, the trouble in reading data due to an overshoot of the data signal can be avoided and data can quickly be read from a memory cell even when the reference signal for giving a reference when determining a logical value of the data signal from the memory cell is constantly generated.

A third semiconductor memory device according to the invention comprises a plurality of banks (for example, banks 100A and 100B which will be described later), and a differential amplifier (for example, a differential-type sense amplifier 150A-0 which will be described later) for comparing a data signal (for example, a data signal VDA-0 which will be described later) from a memory cell (for example, a memory cell 110MA-0 which will be described later) with a reference signal (for example, a reference signal VREF which will be described later) from a reference cell (for example, a reference memory cell 110MR which will be described later) to read data stored in the memory cell in each of the banks, wherein the reference signal is shared by the plurality of banks.

With this structure, the size of the circuit for. generating the reference signal can be minimized by virtue of, among others, the fact that it is not necessary to generate a separate reference signal for each bank and the fact that the number of control circuits for the generation of the reference signal can be reduced. Thus, the chip area (or chip size) can be reduced.

A fourth semiconductor memory device according to the invention comprises a plurality of banks (for example, banks 100A and 100B which will be described later), a differential amplifier (for example, a differential-type sense amplifier 150A-0 which will be described later) for comparing a data signal (for example, a data signal VDA-0 which will be described later) from a memory cell (for example, a memory cell 110MA-0 which will be described later) with a reference signal (for example, a reference signal VREF which will be described later) from a reference cell (for example, a reference memory cell 110MR which will be described later) to read data stored in the memory cell in each of the banks, and a circuit (for example, a feedback circuit 200A-0, a signal correction circuit 300A-0, a limiter circuit 400A-0 all of which will be described later) for limiting a relative change between the reference signal and the data signal which are received by the differential amplifier in each of the banks, wherein the reference signal is shared by the plurality of banks.

With this structure, the data signal from a memory cell will be higher or lower than the reference signal from the reference cell depending on the content of the data. The differential amplifier compares the data signal with the reference signal and outputs a signal representative of the relation in magnitude of these signals. For example, when the data signal is higher than the reference signal, a signal corresponding to data "1" is outputted. Conversely, when the data signal is lower than the reference signal, a signal corresponding to data "0" is outputted. More specifically, depending upon the content of data stored in a memory cell, the data signal from this memory cell changes with respect to the reference signal, so that a difference will develop between these signals. The differential amplifier amplifies this difference to output a signal corresponding to the data stored in the memory cell.

In the above situation, the relative change between the reference and data signals received by the differential amplifier is limited in each bank. In this case, if the relative change between the reference and data signals is limited to such an extent that the reading of data by the amplification of the difference between the data signal from the memory cell and the reference signal is not hampered, the differential amplifier will not excessively be saturated and the output signal of the differential amplifier will quickly follow the variation of the data signal. Therefore, the trouble in reading data due to an overshoot of the data signal can be avoided in each bank and also data from a memory cell can quickly be read, without causing an increase in chip area, without the need for having the reference signal synchronized with the data signal in each bank and even when the reference signal for giving a reference when determining a logical value of the data signal from the memory cell is continuously generated.

A fifth semiconductor memory device according to the invention comprises a plurality of banks (for example, banks 100A and 100B which will be described later), a differential amplifier (for example, a differential-type sense amplifier 150A-0 which will be described later) for comparing a data signal (for example, a data signal VDA-0 which will be described later) from a memory cell (for example, a memory cell 110MA-0 which will be described later) with a reference signal (for example, a reference signal VREF which will be described later) from a reference cell (for example, a reference memory cell 110MR which will be described later) to read data stored in the memory cell in each of the banks, and a circuit (for example, a signal correction circuit 300A-0 which will be described later) for reflecting the data signal upon the reference signal so that a change of the data signal relative to the reference signal is suppressed in each of the banks, wherein the reference signal is shared by the plurality of banks.

With this structure, the data signal from a memory cell will be higher or lower than the reference signal from the reference cell depending on the content of the data. The differential amplifier compares the data signal with the reference signal and outputs a signal representative of the relation in magnitude of these signals. For example, when the data signal is higher than the reference signal, a signal corresponding to data "1" is outputted. Conversely, when the data signal is lower than the reference signal, a signal corresponding to data "0" is outputted. More specifically, depending upon the content of data stored in a memory cell, the data signal from this memory cell changes with respect to the reference signal, so that a difference will develop between these signals. The differential amplifier amplifies this difference to output a signal corresponding to the data stored in the memory cell.

In the above situation, the data signal is reflected on the reference signal in each bank in such a manner that the change of the data signal from the memory cell is suppressed relative to the reference signal from the reference cell. For example, when the level of the data signal goes up, the level of the reference signal received by the differential amplifier also goes up. Conversely, when the level of the data signal goes down, the level of the reference signal received by the differential amplifier also goes down. As a result, the relative change between the reference and data signals is suppressed, so that the differential amplifier will not excessively be saturated and the output signal of the differential amplifier will quickly follow the variation of the data signal. Therefore, the trouble in reading data due to an overshoot of the data signal can be avoided in each bank and data can quickly be read from a memory cell, without causing an increase in chip area and even when the reference signal for giving a reference when determining a logical value of the data signal from the memory cell is continuously generated.

The first or fourth semiconductor memory device according to the invention may further comprise a feedback circuit (for example, a feedback circuit 200A-0 which will be described later) for momentarily feeding an output of the differential amplifier back to an input node (for example, an input node NIN which will be described later) thereof, to which the data signal is supplied, when data stored in the memory cell is read.

With this structure, the level of the data signal is corrected in accordance with a difference between the data and reference signals when the output of the differential amplifier is fed back to the input node thereof to which the data signal is supplied. In this case, if an arrangement is made such that the level of the output of the differential amplifier becomes substantially equal to the level of the data signal when the level of the data signal is equal to that of the reference signal, the level of the data signal is rendered substantially equal to that of the reference signal as a result of the feedback of the output of the differential amplifier. That is to say, the relative change between the data and reference signals as received by the differential amplifier is suppressed. Consequently, the differential amplifier will not excessively be saturated and the output signal of the differential amplifier will quickly follow the variation of the data signal. Therefore, data from a memory cell can quickly be read out, without the need for having the reference signal synchronized with the data signal and even when the reference signal is continuously generated.

Each of the first to fifth semiconductor memory devices according to the invention may further comprise a first inverter circuit (for example, an inverter circuit 310A-0 which will be described later) for receiving the data signal from the memory cell to output a first signal (for example, a signal Vsain which will be described later) corresponding to the data signal as one input signal to the differential amplifier, and a second inverter circuit (for example, an inverter circuit 320A-0 which will be described later) for receiving the reference signal from the reference cell and the data signal from the memory cell to output a second signal (for example, a signal Vsaref which will be described later) corresponding to the reference signal as the other input signal to the differential amplifier and for causing the second signal to follow the first signal when the data signal is excessively large.

With this structure, the first inverter circuit receives the data signal from a memory cell and outputs to the differential amplifier the first signal whose level corresponds to the level of the data signal. On the other hand, the second inverter circuit receives the reference signal from the reference cell and outputs to the differential amplifier the second signal whose level corresponds to the level of the reference signal.

When the data signal from a memory cell significantly changes and its level becomes excessive, the first signal outputted from the first inverter circuit changes to a large degree and thus tends to significantly change relatively to the second signal outputted from the second inverter. In this case, the second inverter circuit causes the level of the second signal, which is its output signal, to follow the level of the first signal based on the data signal from the memory cell. As a result, the change of the first signal supplied to the differential amplifier as the data signal is suppressed relatively to the second signal supplied to the differential amplifier as the reference signal, so that the relative change between the reference and data signals supplied to the differential amplifier is limited.

The second inverter circuit may be adapted to shift its input threshold value with respect to the reference signal (for example, a reference signal VREF which will be described later) from the reference cell in accordance with the data signal (for example, a data signal VDA-0 which will be described later) from the memory cell.

With this structure, if the input threshold value to the reference signal is moved toward a lower level when the level of the data signal from the memory cell goes up, the level of the reference signal superficially goes up, and the level of the second signal, which is the output signal, moves in the lower direction. As a result, the second signal follows the first signal and the change of the first signal relative to the second signal is thus suppressed, so that the relative change between the reference and data signals supplied to the differential amplifier is limited. In this manner, the second signal can be caused to follow the first signal when the data signal becomes excessively large.

The first inverter circuit may comprise a first transistor (for example, a p-type transistor 311A-0 which will be described later) of a first conductivity type having a control electrode supplied with the data signal from the memory cell and a current path whose one end is connected to a first power supply and a second transistor (for example, an n-type transistor 313A-0 which will be described later) of a second conductivity type connected as a load between the other end of the current path of the first transistor and a second power supply, while the second inverter circuit may comprise a third transistor (for example, a p-type transistor 321A-0 which will be described later) of the first conductivity type having a control electrode supplied with the reference signal from the reference cell and a current path whose one end is connected to the first power supply, a fourth transistor (a p-type transistor 322A-0 which will be described later) of the first conductivity type having a control electrode supplied with the data signal from the memory cell and a current path whose one end is connected to the other end of the current path of the third transistor and a fifth transistor (for example, an n-type transistor 323A-0 which will be described later) of the second conductivity type connected as a load between the other end of the current path of the fourth transistor and the second power supply, wherein the first inverter circuit outputs a signal appearing between the first transistor and the second transistor (for example, at a drain of a transistor 313A-0 which will be described later) as the. first signal while the second inverter circuit outputs a signal appearing between the fourth transistor and the fifth transistor (for example, at a drain of a transistor 323A-0 which will be described later) as the second signal.

With this structure, if the first conductivity type is a p-type, the second conductivity type an n-type, the first power supply a power supply for applying a positive level and the second power supply a power supply for applying the ground level, the first transistor is rendered off, when the data signal from the memory cell is at a high (H) level, and rendered on when the data signal is at a low (L) level. Therefore, when the data signal is at the high level the ground level from the second power supply is outputted through the second transistor and when the data signal is at the low level the positive level from the first power supply is outputted through the first transistor. That is to say, the first inverter circuit functions as an inverter in which the first signal, which is an output signal thereof, changes in the direction opposite to the direction of change of the data signal from the memory cell, and thus outputs the first signal in accordance with the data signal.

On the other hand, the third transistor provided in the second inverter is rendered off, when the reference signal from the reference cell is at a high level, and rendered on when the reference signal is at a low level. Therefore, when this reference signal is at the high level the ground level from the second power supply is outputted through the fifth transistor as the load, and when the reference signal is at the low level the positive level from the first power supply is outputted through the third transistor. That is to say, the second inverter circuit functions as an inverter in which the second signal, which is an output signal thereof, changes in the direction opposite to the direction of change of the reference signal from the reference cell, and thus outputs the second signal in accordance with the reference signal.

When the data signal from the memory cell changes to an excessively high level, the current flowing through the first transistor is suppressed, so that the level of the first signal drops to a large degree. In this case, the current passing through the fourth transistor, whose control electrode is supplied with the data signal, is suppressed, so that the second signal also drops. Consequently, the second signal follows the first signal, so that the change of the first signal relative to the second signal is suppressed, whereby the relative change between the reference and data signals received by the differential amplifier is limited. Thus, the second signal can be caused to follow the first signal, when the data signal becomes excessively large, by shifting the input threshold with respect to the reference signal from the reference cell in accordance with the data signal from the memory cell.

The first or the fourth semiconductor memory device according to the invention may further comprise a limiter circuit (for example, a limiter circuit 400A-0 which will be described later) for limiting a peak value of the data signal received by the differential amplifier.

With this structure, when the peak value of the data signal supplied to the differential amplifier is limited, the difference between the peak value of the data signal and the reference signal is limited. That is to say, the relative change between the data and reference signals supplied to the differential amplifier is limited. As a result, the differential amplifier will not unduly be saturated and the output signal of the differential amplifier will quickly follow the variation of the data signal. Therefore, data can quickly be read from a memory cell, without the need for having the reference signal synchronized with the data signal and even when the reference signal is continuously generated.

As described above, according to the present invention, by the provision of the arrangement for suppressing/limiting the relative change between the reference signal and the data signal, the difference between the data and reference signals supplied to the differential-type sense amplifier will never be excessively large and, thus, even when this semiconductor memory device is of the bank-structure type the differential-type sense amplifier will not make an incorrect determination of data in each bank, so that the read time in each bank can significantly be shortened.

DETAILED DESCRIPTION OF THE PREFERRED EMBODIMENTS

Embodiments of the present invention will now be described with reference to the accompanying drawings.

First Embodiment

Figure 1:
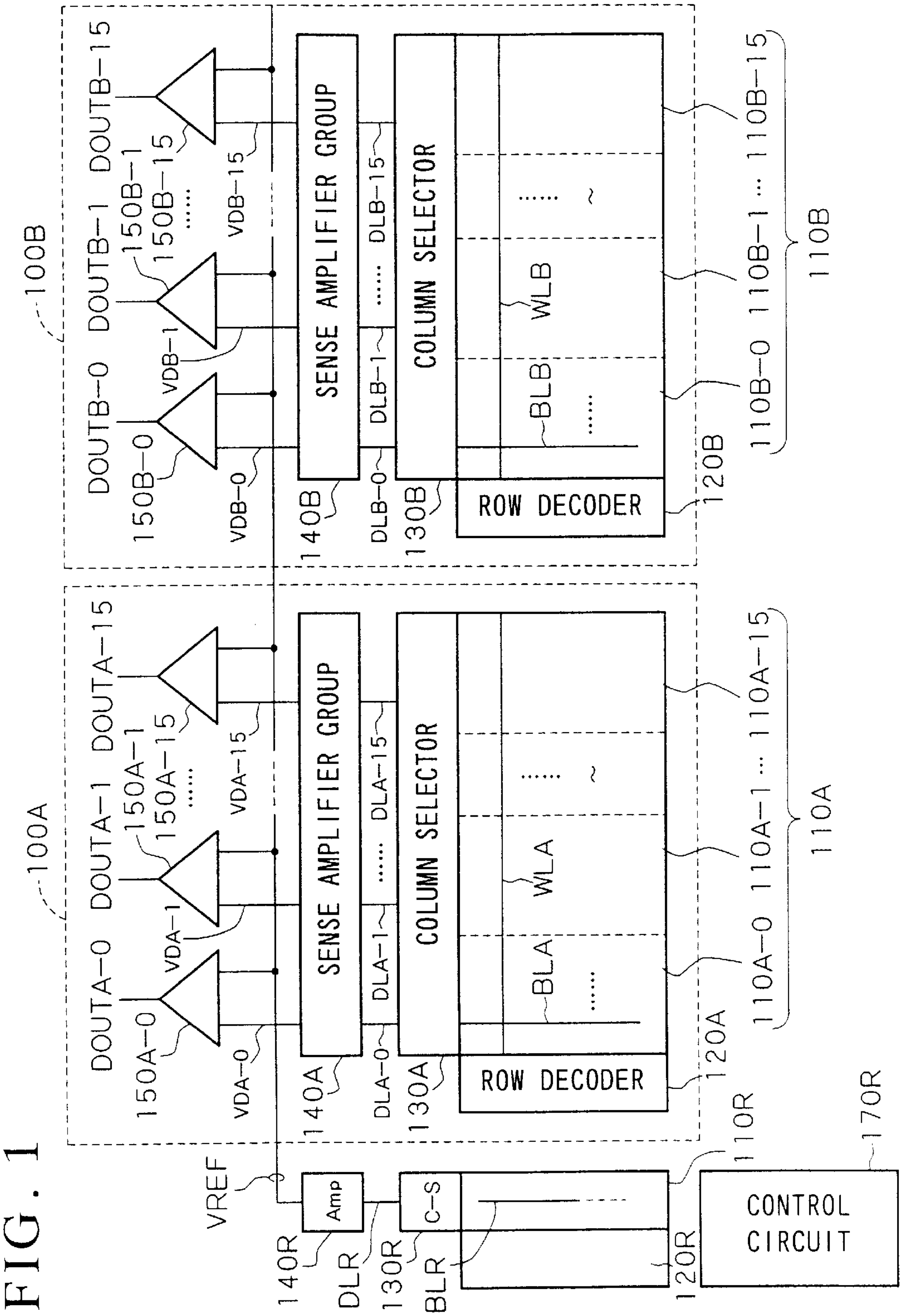
FIG. 1 is an illustration showing a general structure of a semiconductor memory device provided in accordance with a first embodiment of the invention.

FIG. 1 shows a general structure of a semiconductor memory device provided in accordance with a first embodiment of the invention. The semiconductor memory device shown in FIG. 1 is constructed such that it reads data by comparing at a differential-type sense amplifier a data signal from a memory cell with a reference signal from a reference cell, and comprises banks 100A and 100B each adapted to be able to store 16-bit data.

The bank 100A comprises a memory cell array 110A having non-volatile memory cells (not shown) arranged in a matrix. This memory cell array 110A is divided into blocks 110A-1 to 110A-15 in correspondence with bits of 16-bit data DOUTA-0 to DOUTA-15 to be outputted to the outside.

The memory cell array 110A comprises a plurality of word lines WLA extending in the row direction to pass through the blocks 110A-0 to 110A-15, and each block comprises a plurality of bit lines BLA extending in the column direction. Each word line is connected to gates of those plural memory cells which belong to the same row, while each bit line is connected to one terminals (drains) of current paths of those memory cells which belong to the same column.

The word lines WLA of the memory cell array 110A are connected to a row decoder 120A and the bit lines BLA are connected to a column selector 130A. The column selector 130A is arranged such that one of the bit lines is selected in each of the blocks 110A-0 to 110A-15 in accordance with a column address supplied to the bank 100A from the outside. The signals on those bit lines of the respective blocks as selected by the column selector 130A are supplied through data lines DLA-0 to DLA-15 to a group of sense amplifiers 140A.

The sense amplifier group 140A comprises sixteen current-detection type sense amplifiers, each of which corresponds a respective one of the blocks 110A-0 to 110A-15 in the memory cell array 110A and is constructed to detect, in terms of current, a respective one of the data signals on the data lines DLA-0 to DLA-15. Data signals VDA-0 to VDA-15 outputted from the respective sense amplifiers in the sense amplifier group 140A are supplied to one input parts of differential-type sense amplifiers 150A-0 to 150A-15, respectively. The other input parts of these differential-type sense amplifiers 150A-0 to 150A-15 are supplied with a reference signal VREF which gives a reference for determining a logical value of each data signal as will later be described. The differential-type sense amplifiers 150A-0 to 150A-15 output data DOUTA-0 to DOUTA-15.

The bank 100B is constructed in a manner described above for the bank 100A.

More specifically, the bank 100B comprises a memory cell array 110B having non-volatile memory cells (not shown) arranged in a matrix. This memory cell array 110B is divided into blocks 110B-0 to 110B-15 in correspondence with bits of 16-bit data DOUTB-0 to DOUTB-15 to be outputted to the outside.

The memory cell array 110B comprises a plurality of word lines WLB extending in the row direction to pass through the blocks, and each block comprises a plurality of bit lines BLB extending in the column direction. Each word line is connected to gates of those plural memory cells which belong to the same row, while each bit line is connected to one terminals (drains) of current paths of those memory cells which belong to the same column.

The word lines WLB are connected to a row decoder 120B and the bit lines BLB are connected to a column selector 130B. The column selector 130B is arranged such that one of the bit lines is selected in each of the blocks 110B-0 to 110B-15 in accordance with a column address supplied to the bank 100B from the outside. The signals on those bit lines of the respective blocks as selected by the column selector 130B are supplied through data lines DLB-0 to DLB-15 to a group of sense amplifiers 140B.

The sense amplifier group 140B comprises sixteen current-detection type sense amplifiers, each of which corresponds a respective one of the blocks 110B-0 to 110B-15. Data signals VDB-0 to VDB-15 outputted from the respective sense amplifiers in the sense amplifier group 140B are supplied to one input parts of differential-type sense amplifiers 150B-0 to 150B-15, respectively. The other input parts of these differential-type sense amplifiers 150B-0 to 150B-15 are supplied with the reference signal VREF supplied to the bank 100A. The differential-type sense amplifiers 150B-0 to 150B-15 output data DOUTB-0 to DOUTB-15.

A reference cell 110R is provided for deriving the above-described reference signal VREF and is constructed comprising a plurality of reference memory cells which correspond in number to those memory cells in one row of the memory cell arrays 110A and 110B. These reference memory cells are connected to a reference bit line BLR. The bit line BLR is connected through a reference column selector 130R and a data line DLR to an input part of a current-detection type sense amplifier 140R. The column selector 130R is arranged to be equivalent in terms of load to the column selector 130A, 130B in the above-described bank 100A, 100B.

The sense amplifier 140R corresponds to each of the sense amplifiers constituting the sense amplifier groups 140A and 140B in the banks 100A and 100B and detects a current signal outputted from the reference cell 110R to thereby supply the above reference signal VREF to the sense amplifier groups 140A and 140B. The level of this reference signal VREF is selected, when designing this device, to fall in the range between a high level and a low level of a data signal which will be outputted from each sense amplifier in the sense amplifier groups 140A and 140B.

A control circuit 170R is a circuit for adjusting the threshold value of the reference cell to a predetermined value in the manufacturing stage of the device. This threshold value adjustment is carried out in such a manner that, after the initial erasure of the reference cell, a writing operation thereto is repeated until the threshold value of the reference cell reaches the predetermined threshold value.

More specifically, in order to erase the reference cell a negative voltage of about −16 volts is first applied, for example, to its gate with its source, drain and substrate being applied with a voltage of zero volts to expel electrons from a floating gate in the direction of the substrate in accordance with the FN tunneling method. Thereafter, a positive voltage of about 12 volts is applied, for example, to the gate with the drain being applied with a voltage of about six volts and with the source and substrate being applied with a voltage of zero volt to perform a write operation by injecting electrons into the floating gate in accordance with the CHE (Channel Hot Electron) method.

Thereafter, it is verified whether the correct threshold value has been obtained (write verify) by detecting the current flowing through the reference cell in the condition that a voltage of 3 volts is applied to the gate with the drain and source being applied respectively with voltages of 1 volt and zero volt. If electrons have been injected excessively an erase operation is carried out, while a rewrite operation is carried out if electrons lack, depending on the result of the verification. The above process is repeated until the threshold of the reference cell reaches the predetermined value. The threshold voltage of the reference cell is adjusted to a value which is equivalent to that of an off cell (a cell to which writing has been performed) or an on cell (a cell to which writing has not been performed yet), or to an intermediate value of the thresholds of the off cell and the on cell. It should be noted that the control circuit 170R functions only in the manufacturing stage and will not operate in the stage of actual use.

Since the above control circuit 170R deals with a positive high voltage or a negative voltage, transistors incorporated therein are large in size. In addition, the control circuit 170R is connected to a logic circuit operating by means of a regular supply voltage through a level shift circuit and performs complicated processes such as writing, erasure and verification, so that it needs a significantly large area on the chip. Although not shown, such a control circuit is provided not only for the reference cell, but also for each of the sense amplifiers in the sense amplifier groups 140A and 140B to generate various voltages necessary for reading, writing, erasing and verifying operations.

Figure 2:
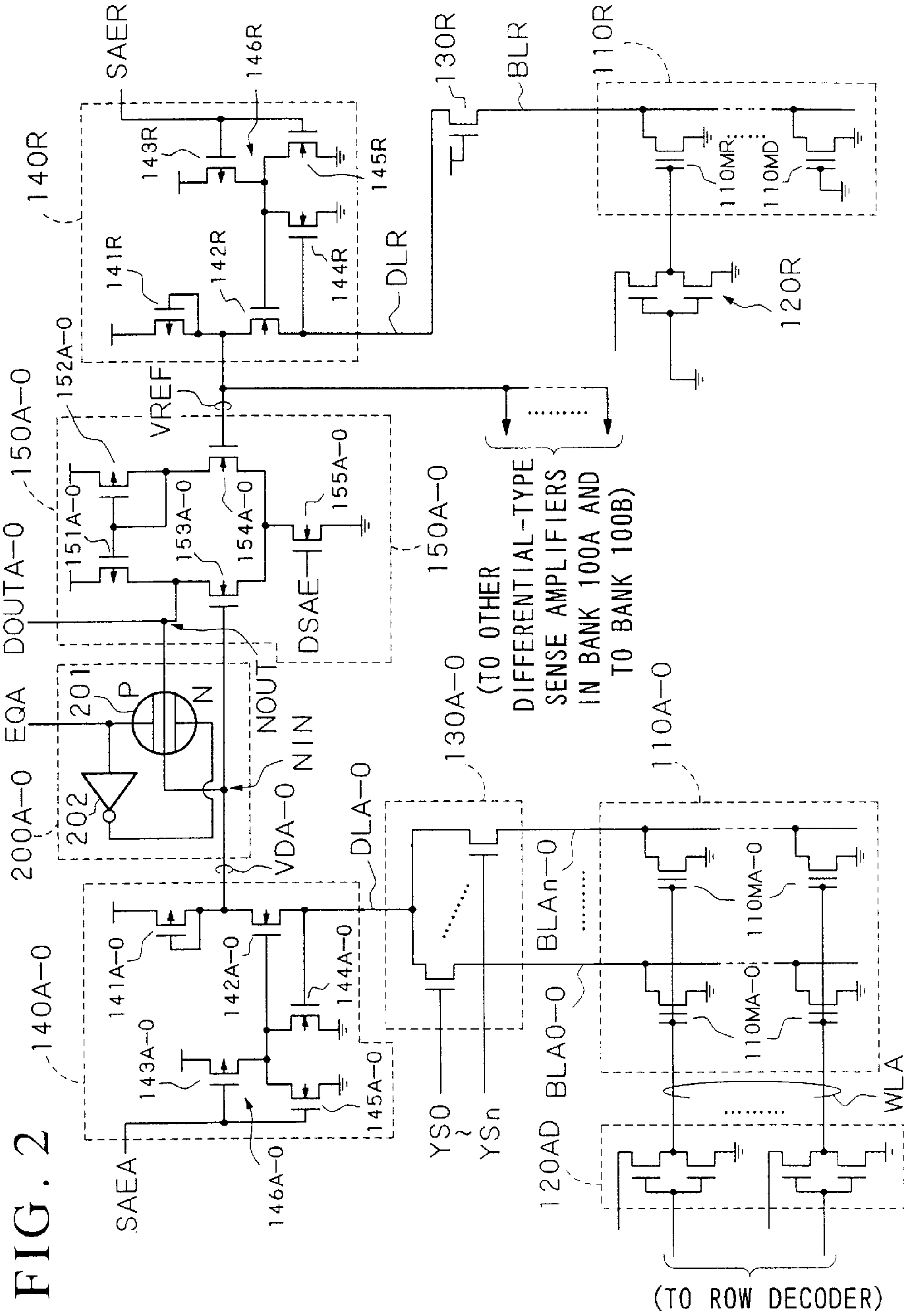
FIG. 2 is an illustration showing a detailed structure of the semiconductor memory device provided in accordance with the first embodiment of the invention.

FIG. 2 shows a more specific circuit structure of the semiconductor memory device, for example, for a read system of the data DOUTA-0. In FIG. 2, the block 110A-0 which constitutes a part of the above-described memory cell array 110A comprises non-volatile memory cells 110MA-0 arranged in a matrix for storing data corresponding to the data DOUTA-0. Each of the word lines WLA arranged to extend in the row direction of the memory cell array 110A is connected to gates of those memory cells which belong to the same row, while each of the bit lines BLA (BLA0-0 to BLAn-0) arranged to extend in the column direction is connected to one ends (drains) of current paths of those memory cells which belong to the same column. The other end (source) of each memory cell is grounded. In the case where this device is a flash memory, however, the source of each memory cell is connected to a control circuit for controlling the source voltage.

A driver 120AD is provided for driving the word lines WLA and constitutes an output stage of the row decoder 120A shown in FIG. 1. The driver 120AD is constructed with CMOS inverters, each of which is supplied with a pre-decoded row address signal at an input part and a source of a ptype transistor thereof to selectively drive one of the word lines WLA to a high level. A voltage level of the address signal applied to the source of each p-type transistor in the driver 120AD is controlled in accordance of the mode of operation.

A selector 130A-0 forms a part of the column selector 130A shown in FIG. 1 and is comprised of a plurality of n-type transistors one of which selectively conducts in accordance with pre-decoded column address YS0 to YSn. One end of current paths of these transistors are connected to the bit lines BLA0-0 to BLAn-0 of the block 110A-0, respectively, while the other ends thereof are connected in common to a data line DLA-0. With this selector 130A-0, by selectively bringing any one bit of the column address YS0 to YSn to a high level, a corresponding one of the data signals appearing simultaneously on the plurality of bit lines of the block 110A-0 is selectively outputted onto the data line DLA-0.

A sense amplifier 140A-0 of the current detection type is constructed to detect a current signal outputted from a memory cell 110MA-0 in the block 110A-0 onto the data line DLA-0 and to output a data signal VDA-0 corresponding to this current signal. More specifically, this sense amplifier 140A-0 is comprised of a p-type transistor 141A-0 connected on the power supply side as a load, an n-type transistor 142A-0 connected between the transistor 141A-0 and the data line DLA-0 for the current detection and an inverter circuit 146A-0 for controlling a gate voltage of the transistor 142A-0. The sense amplifier 140A-0 outputs a voltage signal appearing at a node between the transistor 141A-0 and the transistor 142A-0 as the data signal VDA-0.

The inverter circuit 146A-0 is arranged to output a voltage signal which changes in the direction opposite to the direction of change of the signal on the data line DLA-0 and also to fix its output signal to a low level in response to a sense amplifier enable signal SAEA. More specifically, a p-type transistor 143A-0 and an n-type transistor 144A-0 are connected between the power supply and ground with their current paths arranged in series. An n-type transistor 145A-0 is connected to the transistor 144A-0 in parallel therewith. A gate of the transistor 144A-0 is connected to the data line DLA-0, and gates of the transistors 143A-0 and 145A-0 are supplied with the sense amplifier enable signal SAEA.

In the above inverter circuit 146A-0, those transistors which actually function for an inverter are the p-type transistor 143A-0 and the n-type transistor 144A-0, wherein the transistor 143A-0 functions as a load resistor while the transistor 144A-0 functions as an amplifier of the grounded source type. The n-type transistor 145A-0 serves to fix the output of the above inverter to a low level.

With this inverter circuit 146A-0 the voltage of the signal on the data line DLA-0 is amplified by the transistor 144A-0, and the drain voltage of this transistor 144A-0 is outputted onto the data line DLA-0 by the transistor 142A-0 as a source follower. The voltage of the data line DLA-0 settles to a value that is determined by the conductance of the transistor 144A-0 and the load by the transistor 143A-0. The transistors 142A-0 to 144A-0 also function as a voltage regulator for maintaining the voltage applied to the memory cells constant. The reason for this function is that if the drain voltage (Vds) of a memory cell is not constant the drain current (Id) varies, so that the stored information cannot be determined.

Thus, with this sense amplifier 140A-0, when the sense amplifier enable signal SAEA is at a low level, the transistor 143A-0 serves as a load of the transistor 144A-0 and the transistor 145A-0 is kept in the off state. As a result, the inverter circuit 146A-0 operates to output a voltage corresponding to the voltage of the signal on the data line DLA-0 to the gate of the transistor 142A-0 and thus this sense amplifier 140A-0 is brought into an active state.

At this time, if there exists a current flowing through the memory cell 110MA-0 (i.e., when data "1" is read from the cell), the voltage level of the signal on the data line DLA-0 drops and the inverter 146A-0 receiving this voltage level drives the gate voltage of the transistor 142A-0 towards a high level. Consequently, the transistor 142A-0 is turned on, causing the voltage level of the data signal VDA-0 to be lowered.

Conversely, if there exists no current flowing through the memory cell 110MA-0 (i.e., when data "0" is read out), the gate voltage of the transistor 142A-0 becomes stable at a level which is a threshold voltage of the transistor 142A-0 higher than the source voltage of the transistor 142A-0 (the signal level on the data line DLA-0). Consequently, the transistor 142A-0 is rendered off, so that the voltage level of the data signal VDA-0 is raised by the load transistor 141A-0.

Thus, when the sense amplifier enable signal SAEA is at a low level, the sense amplifier 140A-0 is activated whereupon the voltage level of the data signal VDA-0 outputted from this sense amplifier 140A-0 varies toward a high or a low level depending on the data content of the memory cell 110MA-0.

When the sense amplifier enable signal SAEA is at a high level, the transistor 145A-0 is fixed in an on state. In this case, the gate voltage of the transistor 142A-0 is driven to a low level by the transistor 145A-0 to fix the transistor 142A-0 in the off state. Thus, this sense amplifier 140A-0 is brought into an inactive state, so that the data signal VDA-0 is maintained at a high level.

The reference cell 110R is constructed comprising a reference memory cell 110MR and a plurality of memory cells 110MD, each of these memory cells having properties equivalent to those of a regular memory cell belonging to the above-described memory cell arrays 110A and 110B. A gate of the memory cell 110MR is driven by a driver 120R, and gates of the memory cells 110MD are grounded. Drains of the memory cells 110MR and 110MD are connected in common to the reference bit line BLR, and their sources are grounded.

An input part of the driver 120R is grounded, so that a word line or a gate of the reference memory cell 110MR is fixed at a high level. The memory cell 110MR is the only reference cell that actually functions, and the memory cells 110MD are fixed in the off state. In contrast, in the conventional device described above, the word line on the reference cell side is caused to rise at the same timing as that for a word line of the memory cells 110MA-0.

In the case where verification is performed by changing the gate voltage of a memory cell in the verify mode, the voltage of the word line, i.e., the gate voltage of the memory cell, is changed by switching bias supply circuits (not shown) in the row decoder. This control is carried out by a not-shown control circuit based on commands from an external CPU (Central Processing Unit).

In this embodiment, since the reference signal is used in common by the banks 100A and 100B, it is not allowed to freely change the sensitivity of the sense amplifier 140R in the verify mode as in the prior art. If it is preferred to change the sensitivity of the sense amplifier, such change must be performed on the side of the sense amplifier group 140A for data.

The reference bit line BLR is connected to the reference data line DLR through the reference column selector 130R. The column selector 130R is constituted by an n-type transistor whose properties are equivalent to those of transistors constituting the column selectors 130A and 130B of the respective banks. The transistor of the column selector 130R has a gate connected to the power supply and is fixed in the on state. Thus, the bit line BLR is connected through the column selector 130R and the data line DLR to the sense amplifier 140R of the current detection type, so that this sense amplifier 140R always receives a current signal from the reference memory cell 110MR.

The sense amplifier 140R of the current detection type has basically the same structure as the above-described sense amplifier 140A-0 of the current detection type and detects the current signal outputted from the reference cell 110R to the data line DLR to thereby output a voltage signal as the reference signal VREF. More specifically, the sense amplifier 140R is comprised of a p-type transistor 141R connected on the power supply side as a load, an n-type transistor 142R connected between the transistor 141R and the data line DLR for the current detection, and an inverter circuit 146R for controlling a gate voltage of the transistor 142R. The sense amplifier 140R outputs a voltage signal appearing at a node between the transistor 141R and the transistor 142R as the reference signal VREF.

The inverter circuit 146R is constructed so as to output a voltage signal which change in a direction opposite to the direction of change of the signal on the data line DLR to thereby keep the voltage of the data line DLR at a predetermined voltage. The inverter circuit is also constructed to fix its output signal to a low level in response to the sense amplifier enable signal SAER. More specifically, a p-type transistor 143R and an n-type transistor 144R are connected between the power supply and ground with their current paths arranged in series, and an n-type transistor 145R is connected to the transistor 144R in parallel therewith.

A gate of the transistor 144R is connected to the data line DLR, and gates of the transistors 143R and 145R are supplied with the sense amplifier enable signal SAER. This sense amplifier enable signal SAER is a signal for controlling the active state of the sense amplifier 140R and may always be activated in the condition fixed to a low level or may be activated when either of the above-described sense amplifier enable signal SAEA or a sense amplifier enable signal SAEB, which will be described later, is activated.

In the above inverter circuit 146R, those transistors which actually function for an inverter are the p-type transistor 143R and the n-type transistor 144R, wherein the transistor 143R functions as a load resistor while the transistor 144R functions as an amplifier of the grounded source type. The n-type transistor 145R serves to fix the output of the above inverter to a low level.

With this inverter circuit 146R, the voltage of the signal on the data line DLR is amplified by the transistor 144R, and the drain voltage of this transistor 144R is outputted onto the data line DLR by the transistor 142R as a source follower. The voltage of the data line DLR settles to a value that is determined by the conductance of the transistor 144R and the load by the transistor 143R. The transistors 142R to 144R also function as a voltage regulator for maintaining the voltage applied to the memory cells constant. If the drain voltage (Vds) of a memory cell is not constant the drain current (Id) varies, so that the stored information cannot be determined.

The current drive capacity of each of the transistor 141A-0 of the sense amplifier 140A-0 and the transistor 141R of the sense amplifier 140R is selected in the following manner. In the case where the threshold of the reference cell is adjusted to the same value as that of an on cell, the current drive capacity of the transistor 141R is selected to be larger, i.e., the load resistance is selected to be smaller. In contrast, in the case where the threshold of the reference cell is adjusted to a value intermediate between those of on and off cells, the current drive capacity of the transistor 141R is selected to be the same as that of the transistor 141A-0. By this selection, the level of the reference signal VREF will have an appropriate value between the high and low levels of the data signal VDA-0.

The data signal VDA-0 from the above-described sense amplifier 140A-0 and the reference signal VREF from the sense amplifier 140R are supplied to the differential-type sense amplifier 150A-0 and compared therein. This sense amplifier 150A-0 is comprised of p-type transistors 15 1A-0 and 152A-0 which constitute a so-called current mirror, n-type transistors 153A-0 and 154A-0 for the current detection and an n-type transistor 155A-0 as a constant current source. This constant-current-source transistor 155A-0 is supplied at its gate with a signal DSAE for controlling the active state of this sense amplifier 150A-0.

In this first embodiment, the differential-type sense amplifier 150A-0 outputs a signal representing a logical value "0" when the level of the data signal VDA-0 fed from the current-detection type sense amplifier 140A-0 is higher than the level of the reference signal VREF. Conversely, when the level of the data signal VDA-0 is lower than the level of the reference signal VREF, the sense amplifier 150A-0 outputs a signal representing a logical value "1".

Further connected to the above-described differential-type sense amplifier 150A-0 is a negative feedback circuit 200A-0 which is the characteristic part of this first embodiment. This feedback circuit 200A-0 is a circuit for causing a signal appearing at an output node NOUT of the differential-type sense amplifier 150A-0 (i.e., the output signal of the sense amplifier 150A-0) to momentarily be fed back to a node NIN, which is an input node of the differential-type sense amplifier 150A-0 and to which the data signal VDA-0 is applied, to thereby momentarily limit the relative change between the reference signal VREF and the data signal VDA-0 received by the sense amplifier 150A-0.

More specifically, the feedback circuit 200A-0 is constituted by a transfer gate 201 whose current path is connected between the input node NIN and the output node NOUT of the sense amplifier 150A-0 and an inverter 202. The transfer gate 201 may be constructed by connecting an n-type transistor and a p-type transistor in parallel. A gate of this p-type transistor and the inverter 202 are supplied with a control signal EQA for controlling the conduction state of the transfer gate 201. An output of the inverter 202 (i.e., an inverted signal of the control signal EQA) is supplied to a gate of the above n-type transistor. According to this feedback circuit 200A-0, when the control signal EQA is at a low level, the transfer gate 201 is brought into a conduction state, whereby the output of the sense amplifier 150A-0 is fed back to the input node NIN.

Although not specifically shown, this semiconductor memory device comprises therein, apart from the constituent elements shown in FIGS. 1 and 2, various other peripheral circuits such as an address buffer for receiving an address from the outside and loading it thereinto as an internal address signal, a pre-decoder for pre-decoding an address, an output buffer for supplying the signals fed from the sense amplifiers to the outside and a control circuit for effecting various controls.

Figure 3:
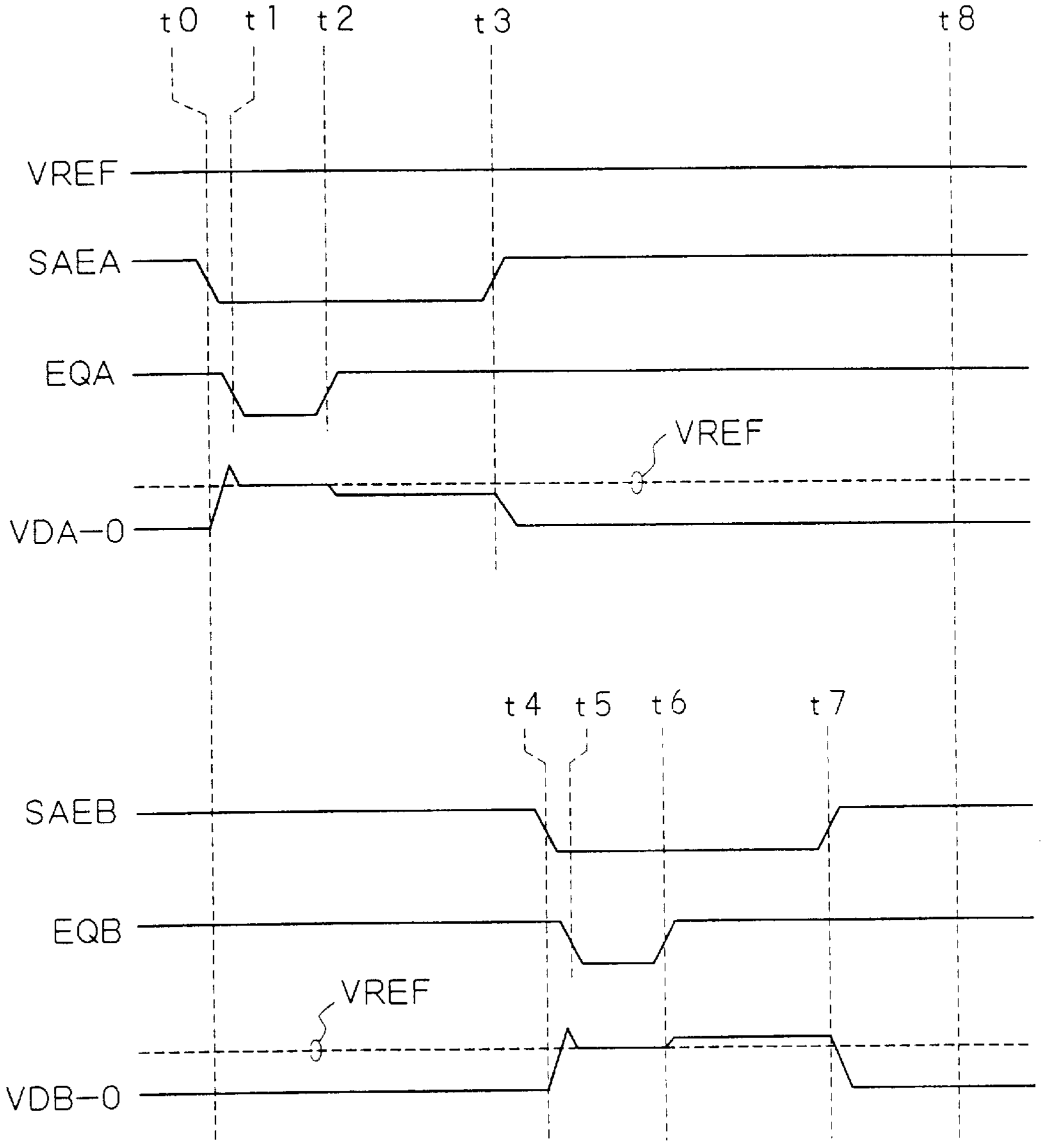
FIG. 3 is a timing chart that explains the operation of the semiconductor memory device provided in accordance with the first embodiment of the invention.

The operation of the semiconductor memory device according to this first embodiment will now be described, with reference to a timing chart shown in FIG. 3, for an exemplary case where data stored in a memory cell 110MA-0 within the block 110A-0 is read out.

First, setting of the mode of operation is performed. For example, the bank 100A is set to the normal read mode, while the bank 100B is set to the erase verify mode. Then, a condition in which the reference signal VREF is constantly generated is established.

Under such conditions, at time to, the highest order sense amplifier control signal SAE (not shown) for controlling all the sense amplifiers in the banks 100A and 100B is changed to a low level and, at the same time, the sense amplifier enable signal SAEA for the bank 100A is changed to a low level, whereupon reading from the bank 100A in the normal read mode is started and the sense amplifier 140A-0 in the bank 100A is activated. Thereby, the sense amplifier 140A-0 start operating, so that the data signal VDA-0 outputted from the sense amplifier 140A-0 starts rising.

Then, during a period from time t1 to time t2, the control signal EQA supplied to the feedback circuit 200A-0 is caused to take a low level. As a result, the transfer gate 201 is brought into an on state, so that the output of the differential-type sense amplifier 150A-0 is fed back to the input node NIN.

When the output of the differential-type sense amplifier 150A-0 is fed back to the input node NIN, the voltage level at the input node NIN (i.e., the voltage level of the data signal VDA-0) is made equal to the reference signal VREF. More specifically, if it is assumed that the data signal VDA-0 is at a voltage level lower than the reference signal VREF, the output voltage of the sense amplifier 150A-0 goes up and is supplied through the feedback circuit 200A-0 to the input node NIN, with the result that the voltage level of the data signal VDA-0 also goes up. Conversely, if the data signal VDA-0 is at a voltage level higher than the reference signal VREF, the output voltage of the sense amplifier 150A-0 goes down and is supplied through the feedback circuit 200A-0 to the input node NIN, as a result of which the voltage level of the data signal VDA-0 also goes down.

Thus, when the output signal of the differential-type sense amplifier 150A-0 is fed back to the input node NIN by the feedback circuit 200A-0, the voltage level of the data signal VDA-0 is rendered equal to the reference signal VREF and then becomes stable. Consequently, the relative change between the reference signal VREF and the data signal VDA-0 is temporarily limited by the feed back circuit 200A-0, so that an overshoot of the data signal VDA-0 is suppressed. In other words, the noise-like relative change between the reference signal VREF and the data signal VDA-0 is temporarily limited.

Subsequently, the control signal EQA resumes the high level at time t2 whereupon the transfer gate 201 of the feedback circuit 200A-0 is brought into an off state, so that the feedback of the output of the differential-type sense amplifier 150A-0 to the input node NIN is blocked. As a result, the data signal VDA-0 settles at the original voltage level corresponding to the current signal from the memory cell and causes a voltage difference to be developed with respect to the reference signal VREF. The differential-type sense amplifier 150A-0 amplifies this voltage difference and outputs a voltage signal. That is to say, the differential-type sense amplifier 150A-0 compares the data signal VDA-0 with the reference signal VREF and outputs a voltage signal which has a logical value representative of the relation in magnitude between the two signals.

Subsequently, when the sense amplifier enable signal SAEA returns to the high level at time t3, the sense amplifier 140A-0 is inactivated whereby the operation of reading from the bank 100A is completed.

Next, readings from the bank 100B in the erase verify mode is started after time t4.

Although a specific structure of the bank 100B corresponding to that of the bank 100A shown in FIG. 2 is not shown, it is substantially identical to that of the bank 100A. In the following description, signals and circuit components in the bank 100B which correspond to those in the bank 100A will be designated by the same labels but each with a letter B instead of the letter A. For example, the sense amplifier enable signal SAEA, sense amplifier 140A0, feedback circuit 200A-0, differential-type sense amplifier 150A-0 and data signal VDA-0 in the bank 100A correspond to sense amplifier enable signal SAEB, sense amplifier 140B-0, feedback circuit 200B-0, differential-type sense amplifier 150B-0 and data signal VDB-0 in the bank 100B, respectively. The operation of reading from the bank 100B will hereinafter be described with reference to the timing chart shown in FIG. 3.

Under the condition that the reference signal VREF is maintained, when the sense amplifier enable signal SAEB for controlling the current-detection type sense amplifier of the bank 100B is switched to a low level at time t4, a sense amplifier of the bank 100B corresponding to the sense amplifier 140A-0 (hereinafter referred to as "sense amplifier 140B-0") is activated. As a result, the sense amplifier 140B-0 starts operating and the data signal VDB-0 (in the bank 100B) begins rising.

Subsequently, the control signal EQB supplied to a feedback circuit, which is connected to the sense amplifier 150B-0 and corresponds to the above-described feedback circuit 200A-0 (and therefore hereinafter referred to as "feedback circuit 200B-0"), is caused to take a low level during a period from time t5 to time t6, as a result of which a transfer gate in the feedback circuit 200B-0 is rendered on, so that the output signal of the differential-type sense amplifier 150B-0 is fed back to its input node. Consequently, the voltage level of the data signal VDB-0 is rendered equal to the reference signal VREF and then becomes stable, so that the relative change between the reference signal VREF and the data signal VDB-0 is temporarily limited and thus an overshoot of the data signal VDB-0 is suppressed.

Subsequently, the control signal EQB resumes the high level at time t6 whereupon the transfer gate of the feedback circuit 200B-0 is brought into the off state, so that the feedback of the output of the differential-type sense amplifier 150B-0 to the input node is blocked. As a result, the data signal VDB-0 settles at the original voltage level corresponding to the current signal from the memory cell and causes a voltage difference to be developed with respect to the reference signal VREF. The differential-type sense amplifier 150B-0 amplifies this voltage difference and outputs a voltage signal which has a logical value representative of the relation in magnitude between the above two signals.

Subsequently, when the sense amplifier enable signal SAEB is returned to the high level at time t7, the sense amplifier 140B-0 is inactivated whereby the reading from the bank 100B is completed. Thereafter, when the highest-order sense amplifier control signal SAE is returned to the high level at time t8, all the sense amplifiers are forced to be fixed in the inactive state and the series of read operation modes are completed.

According to this first embodiment, since the level of the data signal VDA-0 (VDB-0) is rendered stable at the reference signal VREF by means of the feedback circuit 200A-0 (200B-0), not only an overshoot but also an undershoot of the data signal can be suppressed and an excessive relative change between the data signal and the reference signal VREF can effectively be suppressed. Thus, noise on the data signal can be suppressed and the delay in operation of the differential-type sense amplifier can be reduced.

Furthermore, according to this first embodiment, since the reference signal VREF is used in common by the respective banks, the size of the circuit for generating the reference signal VREF can be minimized, with the result that the chip area can effectively be reduced.

Second Embodiment

A second embodiment of the present invention will now be described.

Figure 4:
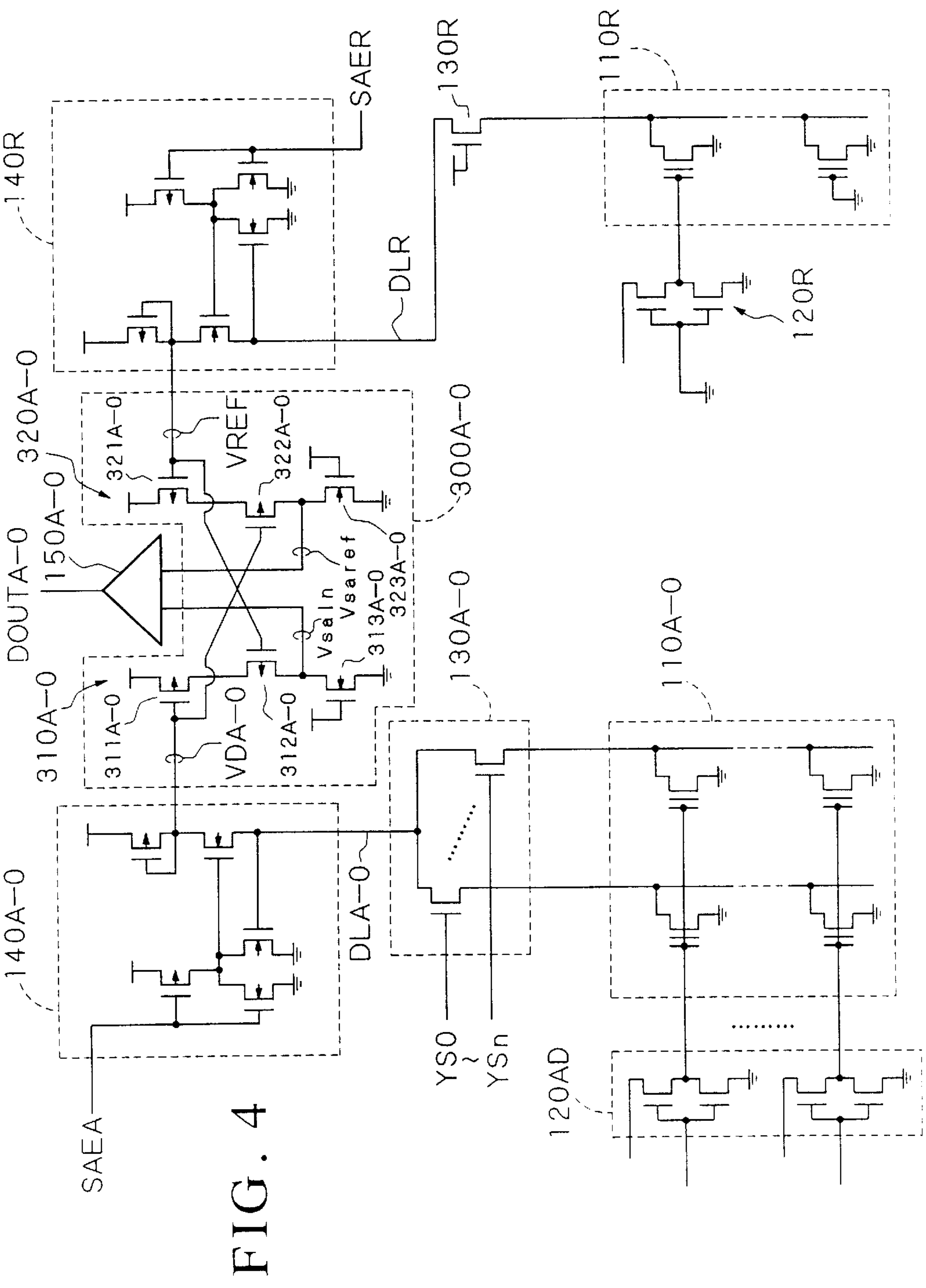
FIG. 4 is an illustration showing a detailed structure of a semiconductor memory device provided in accordance with a second embodiment of the invention.

FIG. 4 shows a detailed structure of a semiconductor memory device according to the second embodiment around a differential-type sense amplifier provided therein.

In the following description made with reference to FIG. 4, description about components that correspond to those of the first embodiment shown in FIG. 2 will be omitted.

As shown in FIG. 4, the semiconductor memory device according to this second embodiment is different in structure from the first embodiment shown in FIG. 2 in that a signal correction circuit 300A-0 is provided, instead of the feedback circuit 200A-0, between the current-detection type sense amplifiers 140A-0 and 140R on the one side and the differential-type sense amplifier 150A-0 on the other side. This signal correction circuit 300A-0 corrects the reference signal VREF and the data signal VDA-0 by reflecting the data signal VDA-0 upon the reference signal VREF so that the relative change of the data signal VDA-0 to the reference signal VREF is suppressed. This signal correction circuit is provided for every differential-type sense amplifier in each bank.

The signal correction circuit 300A-0 is constituted by an inverter circuit 310A-0 which receives the data signal VDA-0 from the sense amplifier 140A-0 and an inverter circuit 320A-0 which receives the reference signal VREF from the sense amplifier 140R. The inverter circuit 310A-0 receives the data signal VDA-0 from a memory cell and outputs a signal Vsain corresponding to this data signal as one input signal to the differential-type sense amplifier 150A-0.

The inverter circuit 320A-0 receives the reference signal VREF as well as the data signal VDA-0 and outputs a signal Vsaref corresponding to the reference signal VREF as the other input signal to the differential-type sense amplifier 150A-0. This inverter circuit causes the signal Vsaref to follow the signal Vsain when the data signal VDA-0 is excessively large. In other words, the inverter circuit 320A-0 shifts the input threshold with respect to the reference signal VREF in accordance with the data signal VDA-0 from a memory cell.

A specific structure of the signal correction circuit 300A-0 will now be described.

In FIG. 4, reference number 311A-0 denotes a p-type transistor having a gate supplied with the data signal VDA-0 from a memory cell and a current path whose one end is connected to a positive power supply, reference number 312A-0 a p-type transistor having a gate supplied with the reference signal VREF and a current path whose one end is connected to the other end of the current path of the transistor 311A-0, and reference number 313A-0 an n-type transistor connected between the other end of the current path of the transistor 311A-0 and the ground power supply as a load, the transistors 311A-0 to 313A-0 constituting the inverter circuit 310A-0. This inverter circuit 310A-0 outputs a signal appearing at the drain of the transistor 313A-0 as the signal Vsain.

Again in FIG. 4, reference number 321A-0 denotes a p-type transistor having a gate supplied with the reference signal VREF from the reference cell and a current path whose one end is connected to the positive power supply, reference number 322A-0 a p-type transistor having a gate supplied with the data signal VDA-0 and a current path whose one end is connected to the other end of the current path of the transistor 321A-0, and reference number 323A-0 an n-type transistor connected between the other end of the current path of the transistor 322A-0 and the ground power supply as a load, the transistors 321A-0 to 323A-0 constituting the inverter circuit 320A-0. This inverter circuit 320A-0 outputs a signal appearing at the drain of the transistor 323A-0 as the signal Vsaref.

In the above structure, a further arrangement is made such that the transistors 311A-0 and 321A-1 are equal in current drive capacity to each other, the transistors 312A-0 and 322A-0 being equal in current drive capacity to each other and the transistors 313A-0 and 323A-0 being equal in current drive capacity to each other. That is to say, the inverter circuits 310A-0 and 320A-0 are symmetrically constructed.

Furthermore, the transistors 312A-0 and 322A-0 are arranged, for example, to have larger gate widths than the transistors 311A-0 and 321A-0 in order to set the current drive capacities of the transistors 312A-0 and 322A-0 to relatively large values. With this arrangement, when the data signal VDA-0 is not excessively large and is thus in the normal condition, the currents flowing through the transistors 312A-0 and 322A-0 will not actually be suppressed, so that the gains of the inverter circuits 310A-0 and 320A-0 will not be adversely affected.

The way of setting the current drive capacities of the transistors 312A-0 and 322A-0 to larger values with respect to the transistors 311A-0 and 321A-0 is not restricted to the above-described way in which the gate widths of the transistors 312A-0 and 322A-0 are selected to be relatively large, but other ways such as decreasing their gate lengths and lowering their threshold values can also be used.

The operation of this second embodiment will now be described with reference to the waveform diagrams shown in FIGS. 5A and 5B. It is assumed here that the reference signal VREF has already been generated.

Figure 5A:
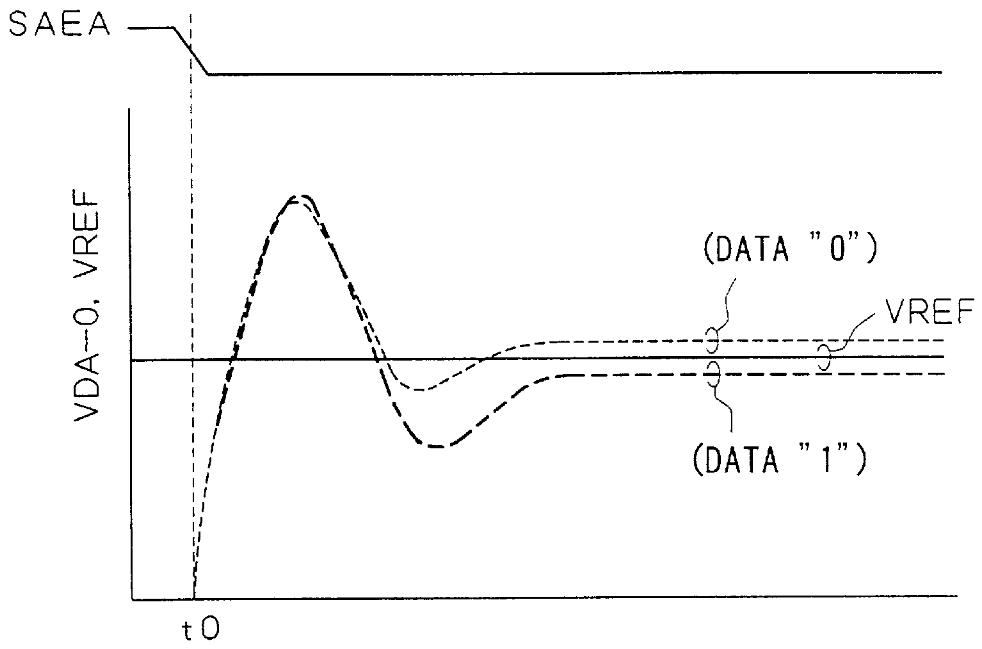
FIGS. 5A and 5B are waveform diagrams showing the operation of the semiconductor memory device provided in accordance with the second embodiment of the invention.

As shown in FIG. 5A, when the sense amplifier enable signal SAEA is changed to a low level at time t0, the current-detection type sense amplifier 140A-0 starts operating and the data signal VDA-0 rises. In this case, the voltage level of the data signal VDA-0 overshoots beyond the reference signal VREF due to the internal operation of the sense amplifier 140A-0 as described above.

Figure 5B:
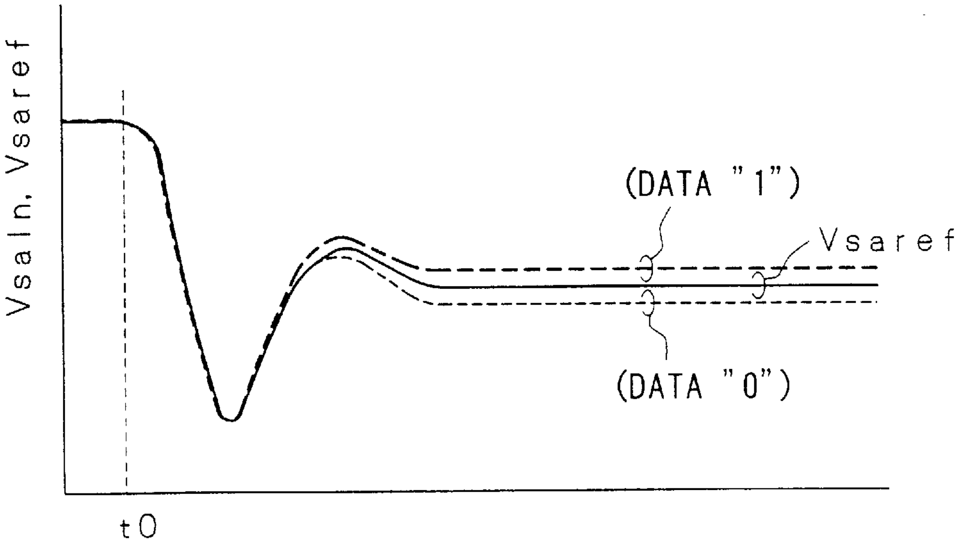

In the above situation, when the data signal VDA-0 overshoots and its voltage level rises, the current of the transistor 311A-0, to which the data signal VDA-0 is supplied at its gate, is suppressed, so that the voltage level of the signal Vsain goes down as shown in FIG. 5B. In this case, the data signal VDA-0 is also supplied to the gate of the transistor 322A-0 of the inverter circuit 320A-0 whereby the current flowing through the transistor 322A-0 is suppressed.

As a result, the input threshold of the inverter circuit 320A-0 with respect to the reference signal VREF is moved in the direction of the high level side, so that the voltage level of the signal Vsaref goes down following the signal Vsain. In other words, a noise-like relative variation between the signals Vsain and Vsaref applied to the differential-type sense amplifier 150A-0 is suppressed. Thus, the voltage difference between the signals Vsain and Vsaref will not become excessively large. Therefore, the differential-type sense amplifier 150A-0 will not be saturated even when the data signal VDA-0 overshoots.

Thereafter, when the data signal VDA-0 settles at a voltage level higher or lower than the reference signal VREF depending on the content of data from a memory cell as shown in FIG. 5A, the signal Vsain received by the differential-type sense amplifier 150A-0 also settles at a voltage level lower or higher than the signal Vsaref. The differential-type sense amplifier 150A-0 amplifies the voltage difference between these signals and outputs the data signal DOUTA-0 having a logical value determined by the relation in magnitude between these signals.

As described above, according to the semiconductor memory device according to this second embodiment, the data signal VDA-0 is reflected on the reference signal VREF so that the variation of the data signal VDA-0 relative to the reference signal VREF is suppressed. When paying attention to the fact that the voltage difference between the signals Vsain and Vsaref supplied to the differential-type sense amplifier 150A-0 is prevented from becoming excessively large, this second embodiment may also be considered to be of the type that the relative change between the signals supplied to the differential-type sense amplifier 150A-0 is temporarily limited, as the above-described first embodiment.

In this second embodiment, although the inverter circuits 310A-0 and 320A-0 have been constructed symmetrically, the transistor 312A-0 may be omitted. This transistor 312A-0 has been added, in accordance with the provision of the transistor 322A-0 in the inverter circuit 320A-0, to bring the input output characteristics of the inverter circuits 310A-0 and 320A-0 into agreement. Therefore, if the input output characteristics of the inverter circuits 310A-0 and 320A-0 are equivalent to each other under the condition that the data signal VDA-0 is at a normal voltage level and thus not at a nose-like excessive voltage level due, for example, to an overshoot, the transistor 312A-0 may be dispensed with.

Third Embodiment

A third embodiment of the present invention will now be described.

Figure 6:
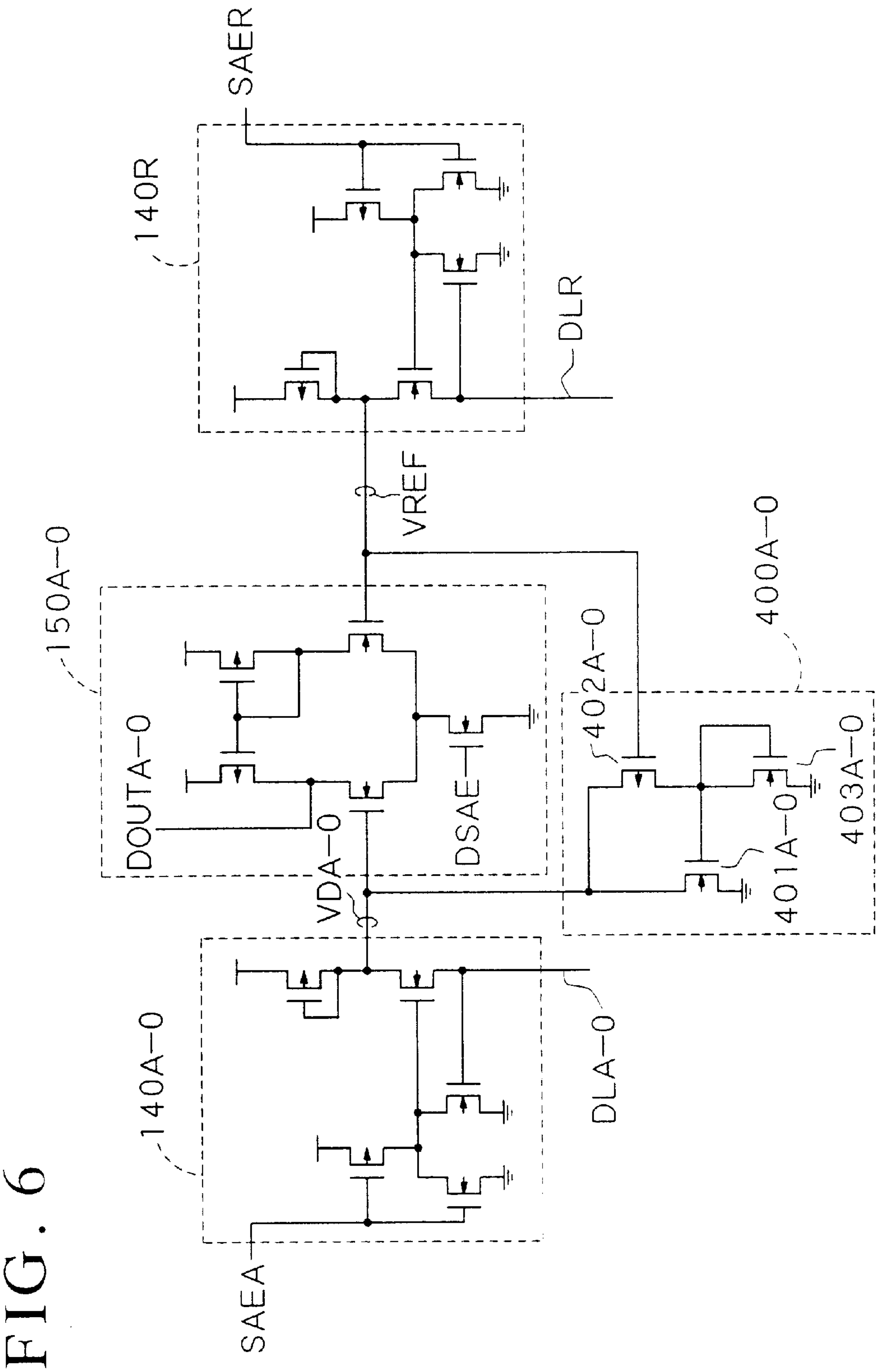
FIG. 6 is an illustration showing a structure of a semiconductor memory device provided in accordance with a third embodiment of the invention.

FIG. 6 shows a detailed structure of a semiconductor memory device according to this third embodiment around its differential-type sense amplifier 150A-0. In the following description, components in FIG. 6 that corresponds to those of the first embodiment shown in FIG. 2 will not be described.

As shown in FIG. 6, the semiconductor memory device according to this third embodiment is different in structure from the first embodiment shown in FIG. 2 in that a limiter circuit 400A-0 for limiting a peak value of the data signal VDA-0 supplied to the differential-type sense amplifier 150A-0 is provided instead of the feedback circuit 200A-0. This limiter circuit is provided for each of all the differential-type sense amplifiers in each bank.

The limiter circuit 400A-0 is constituted by an n-type drive transistor 401A-0 for driving the data signal VDA-0 to a low level, a p-type detection transistor 402A-0 for detecting a voltage difference between the data signal VDA-0 and the reference signal VREF and an n-type load transistor 403A-0 for maintaining the transistor 401A-0 in an off state.

More specifically, the drive transistor 401A-0 has a drain connected to an input node of the differential-type sense amplifier 150A-0, to which the data signal VDA-0 is supplied, and a source that is grounded. The detection transistor 402A-0 has a source connected to the drain of the transistor 401A-0, i.e., the input node of the differential-type sense amplifier 150A-0 to which the data signal VDA-0 is supplied, and a gate connected to another input node of the differential-type sense amplifier 150A-0 to which the reference signal VREF is supplied. Drain and gate of the load transistor 403A-0 is connected together with a source of the transistor 402A-0 to a gate of the transistor 401A-0.

The operation of this third embodiment will now be described with reference to the waveform diagram shown in FIG. 7 wherein it is assumed that the reference signal VREF has already been generated.

Figure 7:
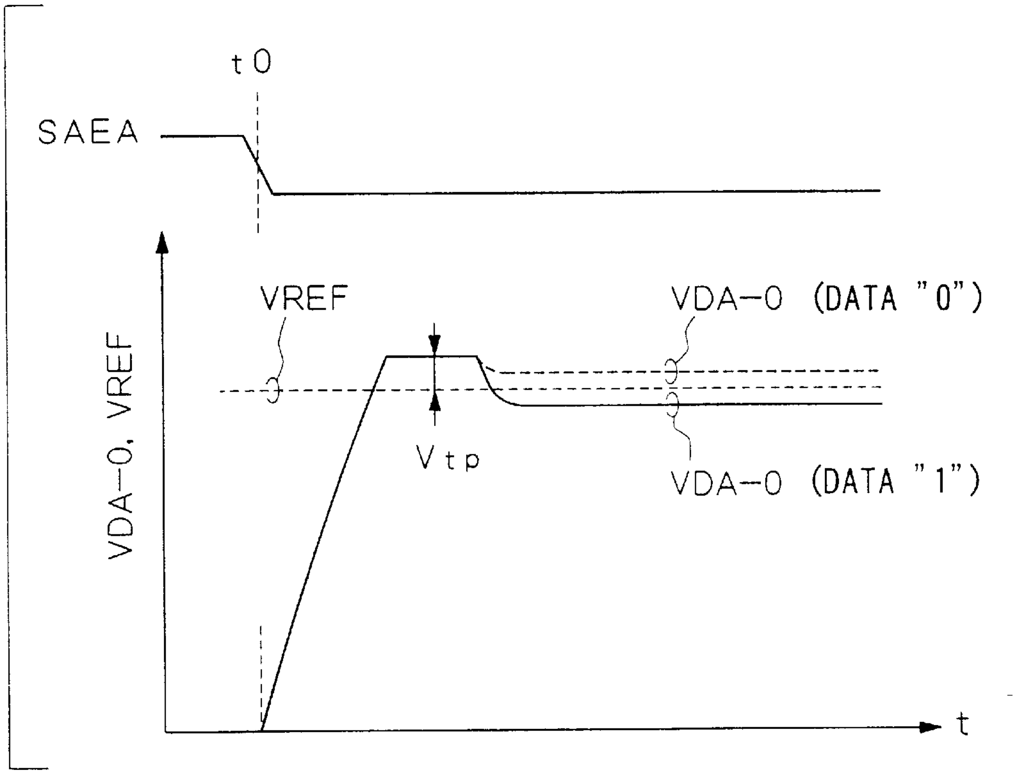
FIG. 7 is a waveform diagram showing the operation of the semiconductor memory device provided in accordance with the third embodiment of the invention.
Figure 8:
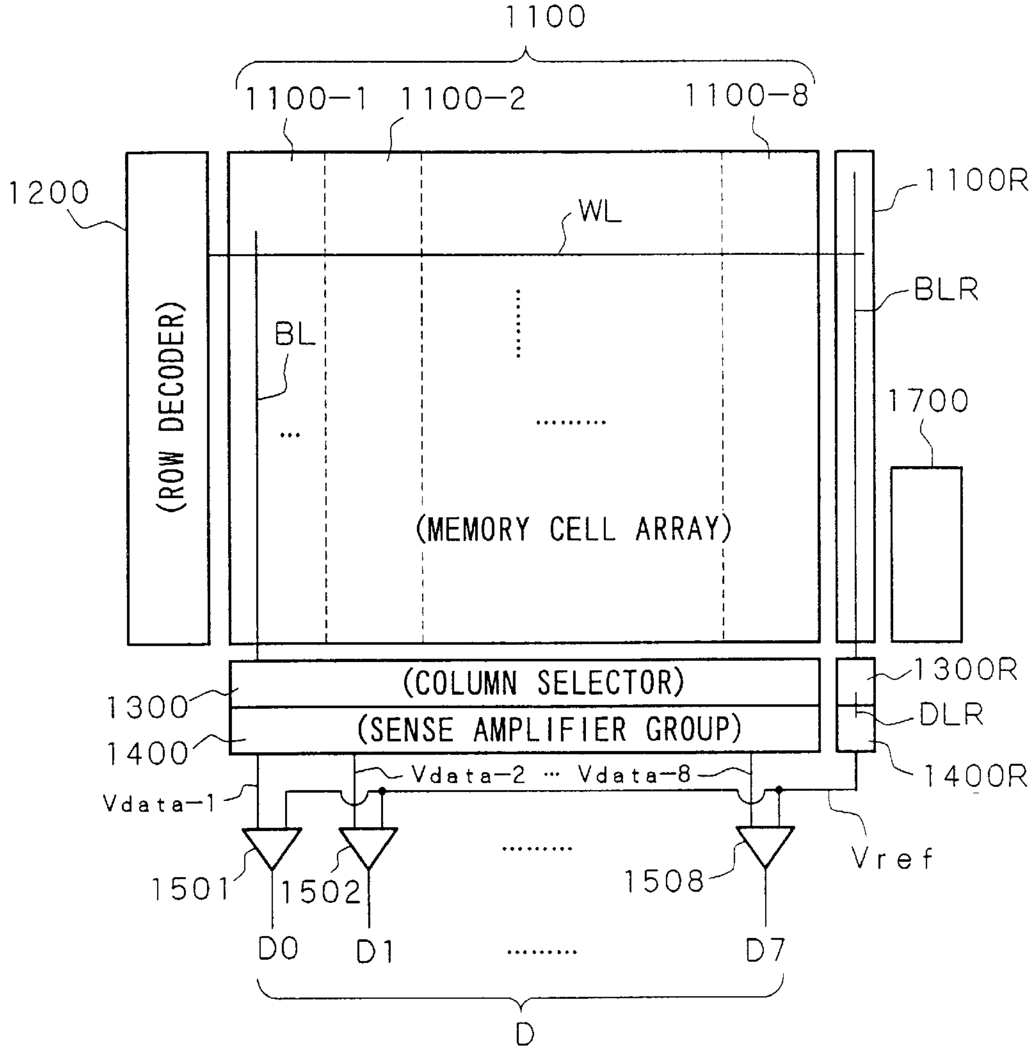
FIG. 8 is an illustration showing a general structure of a conventional semiconductor memory device.
Figure 9:
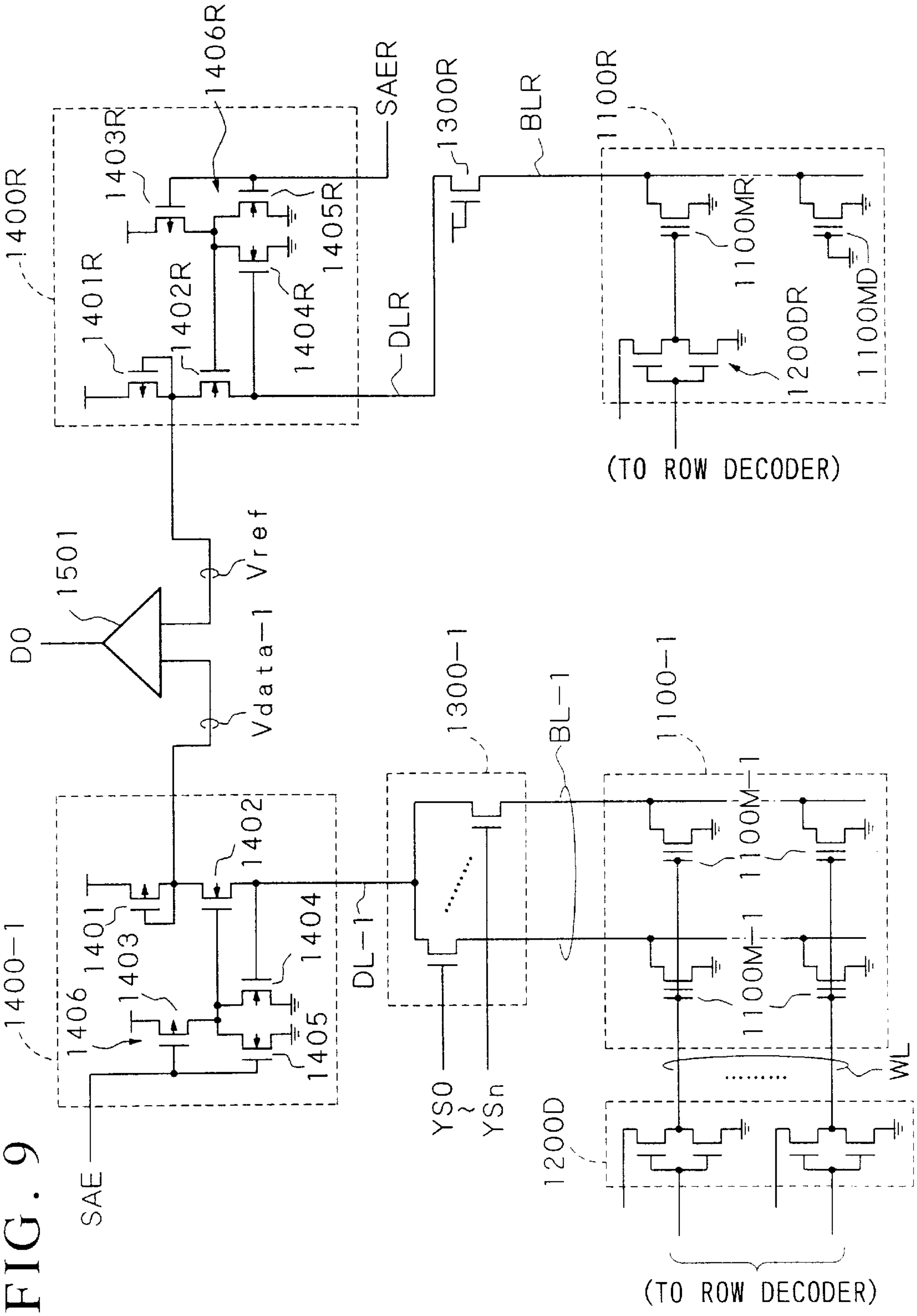
FIG. 9 is an illustration showing a detailed structure of the conventional semiconductor memory device.
Figure 10:
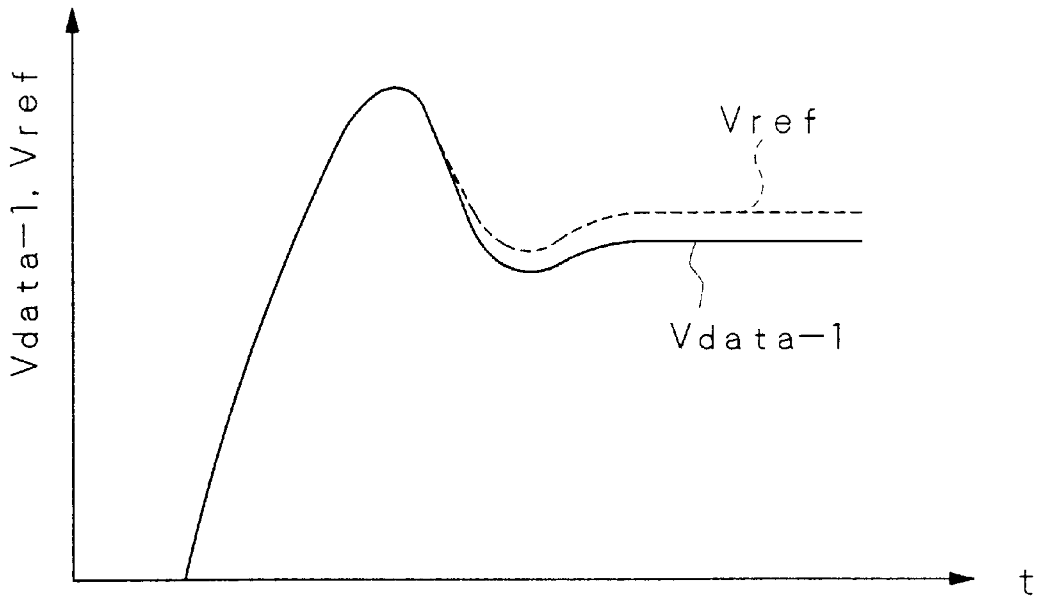
FIG. 10 is a waveform diagram showing the operation of the conventional semiconductor memory device.
Figure 11:
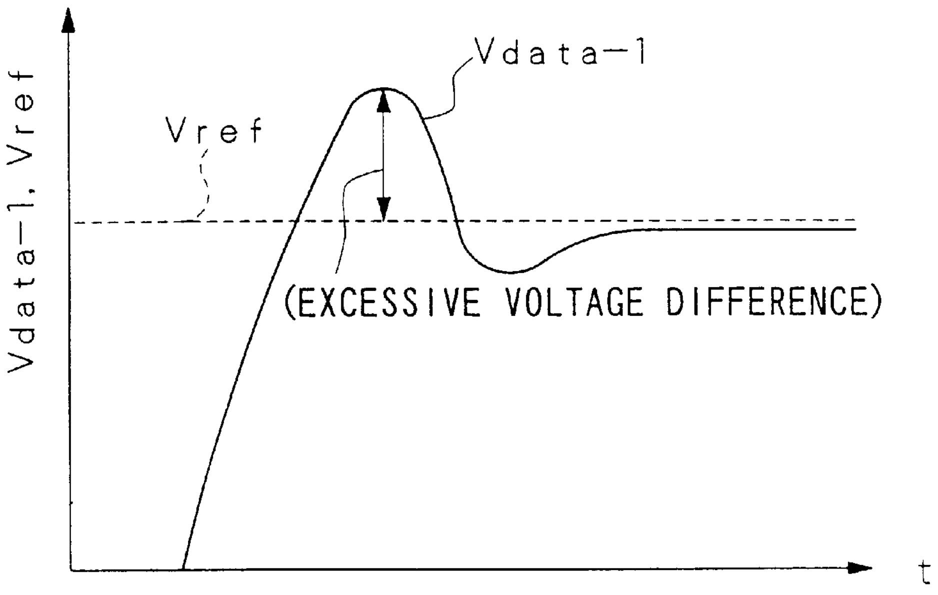
FIG. 11 is another waveform diagram showing the operation of the conventional semiconductor memory device (when the reference signal is fixed at a constant voltage).

As shown in FIG. 7, when the sense amplifier enable signal SAEA is changed to a low level at time t0, the current-detection type sense amplifier 140A-0 start operating and the data signal VDA-0 begins rising. In this case, the voltage level of the data signal VDA-0 overshoots beyond the reference signal VREF due to the internal operation of the sense amplifier 140A-0 as described above.

After the data signal VDA-0 has passed the reference signal VREF and when their voltage difference reaches a threshold value Vtp of the transistor 402A-0, this transistor 402A-0 turns on, so that the gate voltage of the drive transistor 401A-0 rises above a threshold value thereof. As a result, the drive transistor 401A-0 is turned on, whereby further rising of the data signal VDA-0 is limited. That is to say, the data signal VDA-0 is fixed at voltage level which is the threshold value Vtp higher than the reference signal VREF and a peak value of the data signal VDA-0 is thus limited. In other words, the relative variation between the data signal VDA-0 and the reference signal VREF as received by the differential-type sense amplifier 150A-0 is suppressed by the limiter circuit 400A-0. Therefore, the voltage difference between the data signal VDA-0 and the reference signal VREF will not become excessively large and the differential-type sense amplifier 150A-0 will not be saturated.

Thereafter, when the data signal VDA-0 settles at a voltage level higher or lower than the reference signal VREF depending on the content of data from a memory cell, the differential-type sense amplifier 150A-0 amplifies the voltage difference between these signals and outputs the data signal DOUTA-0 having a logical value determined by the relation in magnitude between these signals.

In the conventional device, if the reference signal is simply shared by a plurality of banks, the differential-type sense amplifier will make incorrect determination of data immediately after the start of operation of the current-detection type sense amplifier and it will take a substantial time until the correct read data resumes. In contrast, according to the present invention, since the means for suppressing/limiting the relative variation between the data signal and the reference signal is provided, the difference between the data signal and the reference signal received by the differential-type sense amplifier never becomes excessively large, so that the differential-type sense amplifier in each bank will not make incorrect determination of data and that the read time in each bank can remarkably be reduced.

Although the present invention has been described above with respect to the first to third specific embodiments, the present invention should not be restricted to these embodiments only but may include various changes and modifications thereof made without departing from the spirit of invention, all of which should be construed to fall within the scope of the present invention.

In the first to third embodiments described above, for example, although the present invention has been applied by way of example to a semiconductor memory device having the bank structure, the invention should not be restricted to such device but is applicable to any type of semiconductor memory device provided that it is so constructed that data is read by comparing a data signal from a memory cell with a reference signal from a reference cell by means of a differential amplifier.

Also, although data of sixteen-bit length is dealt with in the first to third embodiments described above, the present invention should not be restricted to such bit length but can deal with data of any bit length.

Furthermore, although the output of the differential-type sense amplifier is fed back to its input side through the transfer gate 201 in the first embodiment described above, the present invention should not be restricted to such structure, but the feedback may be made through any one of p-type and n-type transistors only or through an appropriate resistive component.

Furthermore, although the signal correction circuit 300A-0 is constituted by the inverter circuits 310A-0 and 320A-0 in the second embodiment described above, the inverter circuits 310A-0 and 320A-0 may be constructed as so-called level shifters.

Furthermore, although the difference of the data signal VDA-0 from the reference signal VREF is detected to limit the peak value of the data signal VDA-0 on the basis of the reference signal VREF in the third embodiment described above, the present invention should not be restricted to such structure, but the data signal VDA-0 may be limited to a predetermined voltage value on the basis of the ground potential.

Furthermore, although the non-volatile semiconductor memory device has been given as an example in the above description, the present invention is applicable to any type of device provided that it is a semiconductor memory device such as a ROM in which stored information is determined by comparing a read signal with a reference signal.

What is claimed is:

1. A semiconductor memory device comprising:

a plurality of differential amplifiers, a first input terminal of each of said plurality of differential amplifiers being connected to a common reference signal generator including a reference cell, a second input terminal of each of said plurality of differential amplifiers being connected to a column selector connected to a plurality of columns of memory cells, and each of said plurality of differential amplifiers being for comparing a data signal from a memory cell with a reference signal from said reference cell to read data stored in said memory cell; and a circuit for limiting a relative change between said reference signal and said data signal which are received by each said differential amplifier.

2. A semiconductor memory device according to claim 1, wherein said device further comprises:

a first inverter circuit for receiving said data signal from the memory cell to output a first signal corresponding to said data signal as one input signal to each said differential amplifier; and a second inverter circuit for receiving said reference signal from the reference cell and said data signal from the memory cell to output a second signal corresponding to said reference signal as the other input signal to each said differential amplifier and for causing said second signal to follow said first signal when said data signal is excessively large.

3. A semiconductor memory device according to claim 2, wherein said second inverter circuit is adapted to shift its input threshold value with respect to said reference signal from the reference cell in accordance with said data signal from the memory cell.

4. A semiconductor memory device according to claim 2, wherein said first inverter circuit and said second inverter circuit have input output characteristics which are equivalent to each other.

5. A semiconductor memory device according to claim 1, wherein said circuit comprises a limiter circuit for limiting a peak value of said data signal received by each said differential amplifier.

6. A semiconductor memory device according to claim 1, wherein said reference cell constantly generates said reference signal.

7. A semiconductor memory device according to claim 1, wherein the relative change between said reference signal and said data signal is limited over a predetermined period from when a change in said data signal begins.

8. A semiconductor memory device according to claim 1, wherein said circuit limits the overshooting and undershooting of said data signal which is input to each differential amplifier.

9. A semiconductor memory device according to claim 1, further comprising a plurality of sense amplifiers, wherein each sense amplifier generates a data signal which overshoots or undershoots, and supplied the generated data signal to said circuit.

10. A semiconductor device according to claim 1, wherein said circuit prevents said differential amplifiers from being saturated.

11. A semiconductor memory device comprising:

a plurality of differential amplifiers, a first input terminal of each of said plurality of differential amplifiers being connected to a common reference signal generator including a reference cell, a second input terminal of each of said plurality of differential amplifiers being connected to a column selector connected to a plurality of columns of memory cells, and each of said plurality of differential amplifiers being for comparing a data signal from a memory cell with a reference signal from said reference cell to read data stored in said memory cell; and a circuit for reflecting said data signal upon said reference signal so that a change of said data signal relative to said reference signal is suppressed.

12. A semiconductor memory device according to claim 11, wherein the change of said data signal relative to said reference signal is suppressed over a predetermined period from when a change in said data signal begins.

13. A semiconductor memory device according to claim 11, wherein said circuit suppresses the overshooting and undershooting of said data signal which is input to each differential amplifier.

14. A semiconductor memory device according to claim 11, further comprising a plurality of sense amplifiers, wherein each sense amplifier generates a data signal which overshoots or undershoots, and supplied the generated data signal to said circuit.

15. A semiconductor device according to claim 11, wherein said circuit prevents said differential amplifiers from being saturated.

16. A semiconductor memory device comprising:

a plurality of banks;

a plurality of differential amplifiers, a first input terminal of each of said plurality of differential amplifiers being connected to a common reference signal generator including a reference cell, a second input terminal of each of said plurality of differential amplifiers being connected to a column selector connected to a plurality of columns of memory cells, and each of said plurality of differential amplifiers being for comparing a data signal from a memory cell with a reference signal from said reference cell to read data stored in said memory cell in each of said banks; and a circuit for limiting a relative change between said reference signal and said data signal which are received by each said differential amplifier in each of said banks;

wherein said reference signal is shared by said plurality of banks.

17. A semiconductor memory device according to claim 16, wherein said circuit comprises a limiter circuit for limiting a peak value of said data signal received by each said differential amplifier.

18. A semiconductor memory device according to claim 16, wherein the relative change between said reference signal and said data signal is limited over a predetermined period from when a change in said data signal begins.

19. A semiconductor memory device comprising:

a plurality of banks;

a plurality of differential amplifiers, a first input terminal of each of said plurality of differential amplifiers being connected to a common reference signal generator including a reference cell, a second input terminal of each of said plurality of differential amplifiers being connected to a column selector connected to a plurality of columns of memory cells, and each of said plurality of differential amplifiers being for comparing a data signal from a memory cell with a reference signal from said reference cell to read data stored in said memory cell in each of said banks; and a circuit for reflecting said data signal upon said reference signal so that a change of said data signal relative to said reference signal is suppressed in each of said banks;

wherein said reference signal is shared by said plurality of banks.

20. A semiconductor memory device according to claim 19, wherein the change of said data signal relative to said reference signal is suppressed over a predetermined period from when a change in said data signal begins.

21. A semiconductor memory device comprising:

a plurality of differential amplifiers, a first input terminal of each of said plurality of differential amplifiers being connected to a common reference signal generator including a reference cell, a second input terminal of each of said plurality of differential amplifiers being connected to a column selector connected to a plurality of columns of memory cells, and each of said plurality of differential amplifiers being for comparing a data signal from a memory cell with a reference signal from said reference cell to read data stored in said memory cell; and a circuit for limiting a relative change between said reference signal and said data signal which are received by each said differential amplifier, wherein said circuit momentarily performs negative feedback from the output of each said differential amplifier to an input node thereof, to which said data signal is supplied, when data stored in said memory cell is read and further comprises:

a first inverter circuit for receiving said data signal from the memory cell to output a first signal corresponding to said data signal as one input signal to said differential amplifier, said first inverter circuit comprising:

a first transistor of a first conductivity type having a control electrode supplied with said data signal from the memory cell and a current path whose one end is connected to a first power supply, and a second transistor of a second conductivity type connected between the other end of said current path of said first transistor and a second power supply as a load, and a second inverter circuit for receiving said reference signal from the reference cell and said data signal from the memory cell to output a second signal corresponding to said reference cell as the other input signal to said differential amplifier and for causing said second signal to follow said first signal when said data signal is excessively large, said second inverter circuit comprising:

a third transistor of said first conductivity type having a control electrode supplied with said reference signal from the reference cell and a current path whose one end is connected to said first power supply, a fourth transistor of said first conductivity type having a control electrode supplied with said data signal from the memory cell and a current path whose one end is connected to the other end of said current path of said third transistor, and a fifth transistor of said second conductivity type connected between the other end of said current path of said fourth transistor and said second power supply as a load;

said first inverter circuit outputting a signal appearing between said first transistor and said second transistor as said first signal, and said second inverter circuit outputting a signal appearing between said fourth transistor and said fifth transistor as a second signal.

22. A semiconductor memory device comprising:

a plurality of differential amplifiers, a first input terminal of each of said plurality of differential amplifiers being connected to a common reference signal generator including a reference cell, a second input terminal of each of said plurality of differential amplifiers being connected to a column selector connected to a plurality of columns of memory cells, and each of said plurality of differential amplifiers being for comparing a data signal from a memory cell with a reference signal from said reference cell to read data stored in said memory cell; and a circuit for reflecting said data signal upon said reference signal so that a change of said data signal relative to said reference signal is suppressed during the period when said plurality of differential amplifiers are activated; the circuit further comprising:

a first inverter circuit for receiving said data signal from the memory cell to output a first signal corresponding to said data signal as one input signal to said differential amplifier, said first inverter circuit comprising:

a first transistor of a first conductivity type having a control electrode supplied with said data signal from the memory cell and a current path whose one end is connected to a first power supply, and a second transistor of a second conductivity type connected between the other end of said current path of said first transistor and a second power supply as a load, and a second inverter circuit for receiving said reference signal from the reference cell and said data signal from the memory cell to output a second signal corresponding to said reference cell as the other input signal to said differential amplifier and for causing said second signal to follow said first signal when said data signal is excessively large, said second inverter circuit comprising:

a third transistor of said first conductivity type having a control electrode supplied with said reference signal from the reference cell and a current path whose one end is connected to said first power supply, a fourth transistor of said first conductivity type having a control electrode supplied with said data signal from the memory cell and a current path whose one end is connected to the other end of said current path of said third transistor, and a fifth transistor of said second conductivity type connected between the other end of said current path of said fourth transistor and said second power supply as a load;

said first inverter circuit outputting a signal appearing between said first transistor and said second transistor as said first signal, and said second inverter circuit outputting a signal appearing between said fourth transistor and said fifth transistor as a second signal.

* * * * *